US 6,639,923 B2

(12) United States Patent
Sato et al.

(10) Patent No.: US 6,639,923 B2
(45) Date of Patent: Oct. 28, 2003

(54) SEMICONDUCTOR LASER DEVICE FOR OPTICAL COMMUNICATION

(75) Inventors: Makoto Sato, Tokyo (JP); Kenji Masuda, Tokyo (JP); Akihiro Adachi, Tokyo (JP); Yasunori Nishimura, Tokyo (JP); Shinichi Takagi, Tokyo (JP); Masao Imaki, Tokyo (JP); Yoshihito Hirano, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 111 days.

(21) Appl. No.: 10/012,311

(22) Filed: Dec. 12, 2001

(65) Prior Publication Data

US 2002/0196820 A1 Dec. 26, 2002

(30) Foreign Application Priority Data

Jun. 14, 2001 (JP) ........................................ 2001-180259

(51) Int. Cl.[7] .......................... H01S 5/022; H01S 5/068
(52) U.S. Cl. .................... 372/29.02; 372/32; 372/36
(58) Field of Search ................................ 372/36, 29.02, 372/32

(56) References Cited

U.S. PATENT DOCUMENTS 5,260,587 A  * 11/1993 Sato ........................... 257/88

6,546,171 B2 * 4/2003 Fukutomi ..................... 385/49

FOREIGN PATENT DOCUMENTS

JP        7-162080        6/1995

* cited by examiner

Primary Examiner—James Davie
(74) Attorney, Agent, or Firm—Burns, Doane, Swecker & Mathis, LLP

(57) ABSTRACT

A backward laser beam radiated from a laser diode is received in a photo diode, and an intensity of a forward laser beam radiated from the laser diode is adjusted according to the intensity of the received backward laser beam. The forward laser beam radiated from the laser diode is collimated in a first lens held by a lens holder, and a most portion of the forward laser beam is output through a package window inclined with respect to an optical axis of the laser diode. The remaining portion of the forward laser beam is reflected on the package window as a reflected laser beam and is transmitted through the first lens to be converged in a narrow area placed above the laser diode. A light shielding plate extending in a plane orthogonal to the optical axis is arranged in a wide area including the narrow area and shields the photo diode from the reflected laser beam from. Therefore, the intensity of the forward laser beam radiated from the laser diode is correctly adjusted. Also, the light shielding plate is not soldered to the laser diode but is fixed to lens fixing posts arranged to support the lens holder. Therefore, a driving current can be supplied to the laser diode through a bonding wire without being influenced by the light shielding plate.

80 Claims, 12 Drawing Sheets

SEMICONDUCTOR LASER DEVICE FOR OPTICAL COMMUNICATION

BACKGROUND OF THE INVENTION

1. Field of the Invention

The present invention relates to a semiconductor laser device for optical communication, and more particularly to a semiconductor laser device in which a laser beam is radiated from a semiconductor laser placed in a hermetically-sealed package and is transmitted to an optical fiber through a window of the package.

2. Description of Related Art

In optical communication using an optical fiber, a semiconductor laser device is used. In this semiconductor laser device, a semiconductor laser (hereinafter, called a laser diode) is placed in a hermetically-sealed package, and a laser beam radiated from the semiconductor laser is transmitted to an optical fiber through a window of the package.

FIG. 16 is a view showing the configuration of a conventional semiconductor laser device. In FIG. 16, 101 indicates a laser diode configured to radiate a forward laser beam for optical communication and radiating a backward laser beam. 102 indicates a lens, arranged in front of the laser diode 101, for collimating the forward laser beam radiated from the laser diode 101. 103 indicates a package window through which the forward laser beam collimated in the lens 102 is output. The forward laser beam radiated from the laser diode 101 is transmitted through the package window 103 and is coupled to an optical fiber 105 through an optical interface unit 104. 106 indicates a photo diode, arranged in the rear of the laser diode 101, for receiving the backward laser beam radiated from the laser diode 101 and monitoring a light intensity of the backward laser beam to adjust a light intensity or wavelength of the forward laser beam according to the monitored light intensity of the backward laser beam. 107 indicates an LD carrier on which the laser diode 101 is mounted. 108 indicates a PD carrier on which the photo diode 106 is fixed. 109 indicates a base carrier on which the LD carrier 107 and the PD carrier 108 are mounted. 110 indicates a hermetically-sealed package in which the members of the conventional semiconductor laser device are arranged. The package window 103 is placed in a frontal side area of the hermetically-sealed package 110.

In the conventional semiconductor laser device having the above configuration, a control operation is performed to maintain intensity of the forward laser beam of the laser diode 101 to a constant value. In detail, because the intensity of the forward laser beam radiated from the laser diode 101 linearly changes with the intensity of the backward laser beam radiated from the laser diode 101, the backward laser beam radiated from the laser diode 101 is received in the photo diode 106, and a driving current supplied to the laser diode 101 is controlled so as to maintain a monitoring current generated in the photo diode 106. Therefore, the intensity of the forward laser beam of the laser diode 101 can be maintained to a constant value.

Also, a part of the forward laser beam radiated from the laser diode 101 is not transmitted through the package window 103 but is reflected on the package window 103 as a reflected laser beam. Therefore, in cases where the reflected laser beam is incident on the photo diode 106, the monitoring current generated in the photo diode 106 changes due to the reflected laser beam. In this case, even though the intensity of the backward laser beam received in the photo diode 106 is constant, the monitoring current is increased. Therefore, a problem has arisen that it is difficult to accurately control the driving current supplied to the laser diode 101. Also, in cases where the reflected laser beam is incident on a forward laser beam emitting point of the laser diode 101, laser beam radiation characteristics of the laser diode 101 are changed. Therefore, it is further difficult to accurately control the driving current supplied to the laser diode 101.

To prevent the reflected laser beam from being incident on the photo diode 106, a conventional semiconductor laser device has been disclosed in Published Unexamined Japanese Patent Application No. H7-162080 (1995). In this conventional semiconductor laser device, a light shielding member is soldered to an upper surface of the laser diode 101.

However, in cases where a manufacturing method of the direct soldering of the light shielding member to the upper surface of the laser diode 101 is adopted, a problem has arisen that the size and weight of the light shielding member is limited.

Also, it is required that a bonding wire is connected with the upper surface of the laser diode 101 to feed a driving current to the laser diode 101. However, in cases where the size of the light shielding member is enlarged, no bonding wire can be connected with the upper surface of the laser diode 101. Therefore, a conductive light shielding member is soldered to the upper surface of the laser diode 101 to supply a driving current to the laser diode 101 through the conductive light shielding member.

However, in the conventional semiconductor laser device for the optical communication, there is a case where the driving current is modulated to change the value of the driving current and is supplied to the laser diode 101 through a binding wire. Therefore, in cases where a modulated driving current is supplied to the laser diode 101 through the conductive light shielding member, an electric resistance of the conductive light shielding member for the modulated driving current is increased, and a problem has arisen that modulation characteristics of the modulated driving current are changed by the increased electric resistance of the conductive light shielding member.

Also, another conventional semiconductor laser device has been disclosed in the application. In this conventional semiconductor laser device, a lateral width of a light shielding member is shorter than that of the laser diode 101 so as to expose an upper surface of the laser diode 101 on a side of the light shielding member, and a bonding wire is directly attached to the upper surface of the laser diode 101 to supply a driving current to the laser diode 101. However, because the lateral width of the light shielding member is short, there is a probability that a part of the reflected laser beam passes through an area near to a side surface of the light shielding member so as to be incident on the photo diode 106.

SUMMARY OF THE INVENTION

An object of the present invention is to provide, with due consideration to the drawbacks of the conventional semiconductor laser device, a semiconductor laser device in which a reflected laser beam is reliably prevented from being received in a photo diode on condition that the supply of a driving current to a laser diode is not disturbed.

The object is achieved by the provision of a wavelength monitoring device of a first inventive idea. That is, the wavelength monitoring device comprises a semiconductor laser configured to radiate a forward laser beam and a backward laser beam, a photo detector configured to receive the backward laser beam radiated from the semiconductor laser, a lens configured to converge the forward laser beam radiated from the semiconductor laser, a window which transmits a most portion of the forward laser beam converged by the lens and on which the remaining portion of the forward laser beam is reflected as a reflected laser beam, a lens fixing member to which the lens is fixed, and a light shielding member, supported by the lens fixing member, for shielding the photo detector from the reflected laser beam.

In the above configuration, the light shielding member shields the photo detector from the reflected laser beam. Accordingly, the light shielding member can reliably prevent the reflected laser beam from being received in the photo detector without giving an adverse influence of the light shielding member on a driving current supplied to the semiconductor laser through a bonding wire.

The object is also achieved by the provision of a wavelength monitoring device of a second inventive idea. That is, the wavelength monitoring device comprises a semiconductor laser configured to radiate a forward laser beam and a backward laser beam, a photo detector configured to receive the backward laser beam radiated from the semiconductor laser, a window which transmits a most portion of the forward laser beam radiated from the semiconductor laser and on which the remaining portion of the forward laser beam is reflected as a reflected laser beam, a carrier on which the semiconductor laser is mounted, and a light shielding member, fixed to the carrier, for shielding the photo detector from the reflected laser beam.

In the above configuration, the light shielding member shields the photo detector from the reflected laser beam. Accordingly, the light shielding member can reliably prevent the reflected laser beam from being received in the photo detector without giving an adverse influence of the light shielding member on a driving current supplied to the semiconductor laser through a bonding wire.

The object is also achieved by the provision of a wavelength monitoring device of a third inventive idea. That is, the wavelength monitoring device comprises a semiconductor laser configured to radiate a forward laser beam and a backward laser beam, a carrier having a slot which is formed on a top surface, the semiconductor laser being arranged in the slot, a photo detector configured to receive the backward laser beam which is radiated from the semiconductor laser, a window which transmits a most portion of the forward laser beam radiated from the semiconductor laser and on which the remaining portion of the forward laser beam is reflected as a reflected laser beam, and a light shielding member, which is placed on the upper surface of the carrier so as to straddle the slot of the carrier, for shielding the photo detector from the reflected laser beam.

In the above configuration, because the light shielding member can be arbitrary placed in both a vertical direction and a direction of an optical axis of the semiconductor laser, the light shielding member can be placed at a position optimum to shield the photo detector from the reflected laser beam. Accordingly, the light shielding member can reliably prevent the reflected laser beam from being received in the photo detector without giving an adverse influence of the light shielding member on a driving current supplied to the semiconductor laser through a bonding wire.

The object is also achieved by the provision of a wavelength monitoring device of a fourth inventive idea. That is, the wavelength monitoring device comprises a semiconductor laser configured to radiate a forward laser beam and a backward laser beam, a photo detector configured to receive the backward laser beam radiated from the semiconductor laser, a lens configured to converge the forward laser beam radiated from the semiconductor laser, a window which transmits a most portion of the forward laser beam converged by the lens and on which the remaining portion of the forward laser beam is reflected as a reflected laser beam, a lens fixing member to which the lens is fixed, and a light shielding member which is supported by the lens fixing member and is formed in a U shape so as to cover an upper peripheral area of the semiconductor device.

In the above configuration, the reflected laser beam is transmitted through the lens to be converged at the upper peripheral area of the semiconductor device, and the light shielding member shields the photo detector from the reflected laser beam converged at the upper peripheral area of the semiconductor device. Accordingly, the light shielding member can reliably prevent the reflected laser beam from being received in the photo detector without giving an adverse influence of the light shielding member on a driving current supplied to the semiconductor laser through a bonding wire.

The object is also achieved by the provision of a wavelength monitoring device of a fifth inventive idea. That is, the wavelength monitoring device comprises a semiconductor laser configured to radiate a forward laser beam and a backward laser beam, a photo detector configured to receive the backward laser beam radiated from the semiconductor laser, a window which transmits a most portion of the forward laser beam radiated from the semiconductor laser and on which the remaining portion of the forward laser beam is reflected as a reflected laser beam, a carrier on which the semiconductor laser is mounted, and a light shielding member which is fixed to the carrier and is formed in a U shape so as to cover an upper peripheral area of the semiconductor device.

In the above configuration, the reflected laser beam is transmitted through the lens to be converged at the upper peripheral area of the semiconductor device, and the light shielding member shields the photo detector from the reflected laser beam converged at the upper peripheral area of the semiconductor device. Accordingly, the light shielding member can reliably prevent the reflected laser beam from being received in the photo detector without giving an adverse influence of the light shielding member on a driving current supplied to the semiconductor laser through a bonding wire.

The object is also achieved by the provision of a wavelength monitoring device of a sixth inventive idea. That is, the wavelength monitoring device comprises a semiconductor laser configured to radiate a forward laser beam and a backward laser beam, a photo detector configured to receive the backward laser beam radiated from the semiconductor laser, a window which transmits a most portion of the forward laser beam radiated from the semiconductor laser and on which the remaining portion of the forward laser beam is reflected as a reflected laser beam, a carrier on which the semiconductor laser is mounted, and a light shielding member which is fixed to the carrier and is formed in an L shape so as to cover an upper peripheral area of the semiconductor device.

In the above configuration, the reflected laser beam is transmitted through the lens to be converged at the upper peripheral area of the semiconductor device, and the light shielding member shields the photo detector from the reflected laser beam converged at the upper peripheral area of the semiconductor device. Accordingly, the light shielding member can reliably prevent the reflected laser beam from being received in the photo detector without giving an adverse influence of the light shielding member on a driving current supplied to the semiconductor laser through a bonding wire.

The object is also achieved by the provision of a wavelength monitoring device of a seventh inventive idea. That is, the wavelength monitoring device comprises a semiconductor laser configured to radiate a forward laser beam and a backward laser beam, a carrier having a slot which is formed on a top surface, the semiconductor laser being arranged in the slot, a photo detector configured to receive the backward laser beam which is radiated from the semiconductor laser, a window which transmits a most portion of the forward laser beam radiated from the semiconductor laser and on which the remaining portion of the forward laser beam is reflected as a reflected laser beam, and a light shielding member which is placed on the upper surface of the carrier so as to straddle the slot of the carrier and so as to cover an upper peripheral area of the semiconductor device.

In the above configuration, the reflected laser beam is transmitted through the lens to be converged at the upper peripheral area of the semiconductor device. Also, because the light shielding member can be arbitrary placed in both a vertical direction and a direction of an optical axis of the semiconductor laser, the light shielding member can be placed at the upper peripheral area of the semiconductor device optimum to shield the photo detector from the reflected laser beam. Accordingly, the light shielding member can reliably prevent the reflected laser beam from being received in the photo detector without giving an adverse influence of the light shielding member on a driving current supplied to the semiconductor laser through a bonding wire.

It is preferred in the wavelength monitoring devices of the first to seventh inventive ideas that the semiconductor laser is partially covered with the light shielding member, and the wavelength monitoring device further comprises a bonding wire which is connected with an upper surface of the semiconductor laser not covered with the light shielding member and through which an electric power is supplied to the semiconductor laser.

Therefore, the light shielding member can reliably prevent the reflected laser beam from being received in the photo detector without giving an adverse influence of the light shielding member on a driving current supplied to the semiconductor laser through the bonding wire.

It is also preferred that a backward end portion of the semiconductor laser is backwardly protruded from a backward surface of the light shielding member, and the bonding wire is connected with an upper surface of the backward end portion of the semiconductor laser.

Therefore, the bonding wire can be reliably connected with the upper surface of the backward end portion of the semiconductor laser.

It is also preferred in the wavelength monitoring devices of the first to seventh inventive ideas that a width of the light shielding member in a direction perpendicular to an optical axis of the semiconductor laser in a plane parallel to an upper surface of the semiconductor laser is longer than a width of the semiconductor laser in the direction.

Therefore, the light shielding member can reliably shield the photo detector from the reflected laser beam.

It is also preferred in the wavelength monitoring devices of the first to seventh inventive ideas that the window is inclined with respect to an optical axis of the semiconductor laser so as to return the reflected laser beam to a specific position placed at a peripheral area of the semiconductor laser, and the light shielding member is arranged at the specific position of the peripheral area of the semiconductor laser.

Therefore, the reflected laser beam does not return to the semiconductor laser, and the light shielding member reliably shield the photo detector from the reflected laser beam.

It is also preferred in the wavelength monitoring devices of the first to seventh inventive ideas that the window is inclined with respect to an optical axis of the semiconductor laser by placing a lower portion of the window near to the lens as compared with a position of an upper portion of the lens, and the light shielding member prevents the reflected laser beam from transmitting through an upper peripheral area of the semiconductor laser.

Therefore, the reflected laser beam is converged at the upper peripheral area of the semiconductor laser, and the light shielding member reliably shield the photo detector from the reflected laser beam.

It is also preferred in the wavelength monitoring devices of the first and second inventive ideas that the light shielding member is formed in a U shape and covers an upper peripheral area and side peripheral areas of the semiconductor laser.

Therefore, the light shielding member reliably shield the photo detector from the reflected laser beam.

It is also preferred in the wavelength monitoring device of the second inventive idea that the light shielding member is formed in an L shape so as to have both a horizontally-extending portion covering an upper peripheral area of the semiconductor laser and a foot portion fixed to the carrier.

Therefore, even though a member is additionally arranged on the carrier, the light shielding member can be arranged so as not to be in contact with the member, and the light shielding member reliably shield the photo detector from the reflected laser beam.

It is also preferred in the wavelength monitoring device of the second inventive idea that a member selected from a group of a circuit substrate for high frequency, an electric current feeding and modulating circuit, a thermister and a micro-strip line is placed on an upper surface of the carrier which is placed on an opposite side to the foot portion of the light shielding member formed in an L shape through the semiconductor laser.

Therefore, the light shielding member can be arranged so as not to be in contact with the member.

It is also preferred in the wavelength monitoring device of the second inventive idea that the light shielding member is arranged between the semiconductor laser and the photo detector, and the light shielding member has a through-hole through which the backward laser beam radiated from the semiconductor laser is transmitted to the photo detector.

Therefore, the light shielding member reliably shield the photo detector from the reflected laser beam.

It is also preferred in the wavelength monitoring devices of the first to seventh inventive ideas that the light shielding member partially surrounds peripheral areas of the semiconductor laser without making contact with the semiconductor laser.

Therefore, the light shielding member reliably shield the photo detector from the reflected laser beam converged at the peripheral areas of the semiconductor laser.

It is also preferred in the wavelength monitoring devices of the first to seventh inventive ideas that the wavelength monitoring device further comprises an optical element arranged between the semiconductor laser and the photo detector.

Therefore, even though a distance between the semiconductor laser and the photo detector is increased by the optical element so as to make a space in which the reflected laser beam is widely diverged, the light shielding member effectively shield the photo detector from the reflected laser beam.

It is also preferred in the wavelength monitoring devices of the first to seventh inventive ideas that the wavelength monitoring device further comprises a control circuit configured to adjust an intensity of the forward laser beam radiated from the semiconductor laser according to an intensity of the backward laser beam detected in the photo diode.

Therefore, the intensity of the forward laser beam can be reliably adjusted.

It is also preferred in the wavelength monitoring devices of the first, second, fourth, fifth and sixth inventive ideas that the light shielding member is a flat plate extending in a plane perpendicular to an optical axis of the semiconductor laser.

Therefore, the light shielding member reliably shield the photo detector from the reflected laser beam It is also preferred in the wavelength monitoring devices of the first to seventh inventive ideas that the light shielding member is not soldered to the semiconductor laser.

Therefore, an adverse influence of the light shielding member is exerted on a driving current supplied to the semiconductor laser through a bonding wire.

DETAILED DESCRIPTION OF THE PREFERRED EMBODIMENTS

Embodiments of the present invention will now be described with reference to the accompanying drawings.

Embodiment 1

Figure 1:
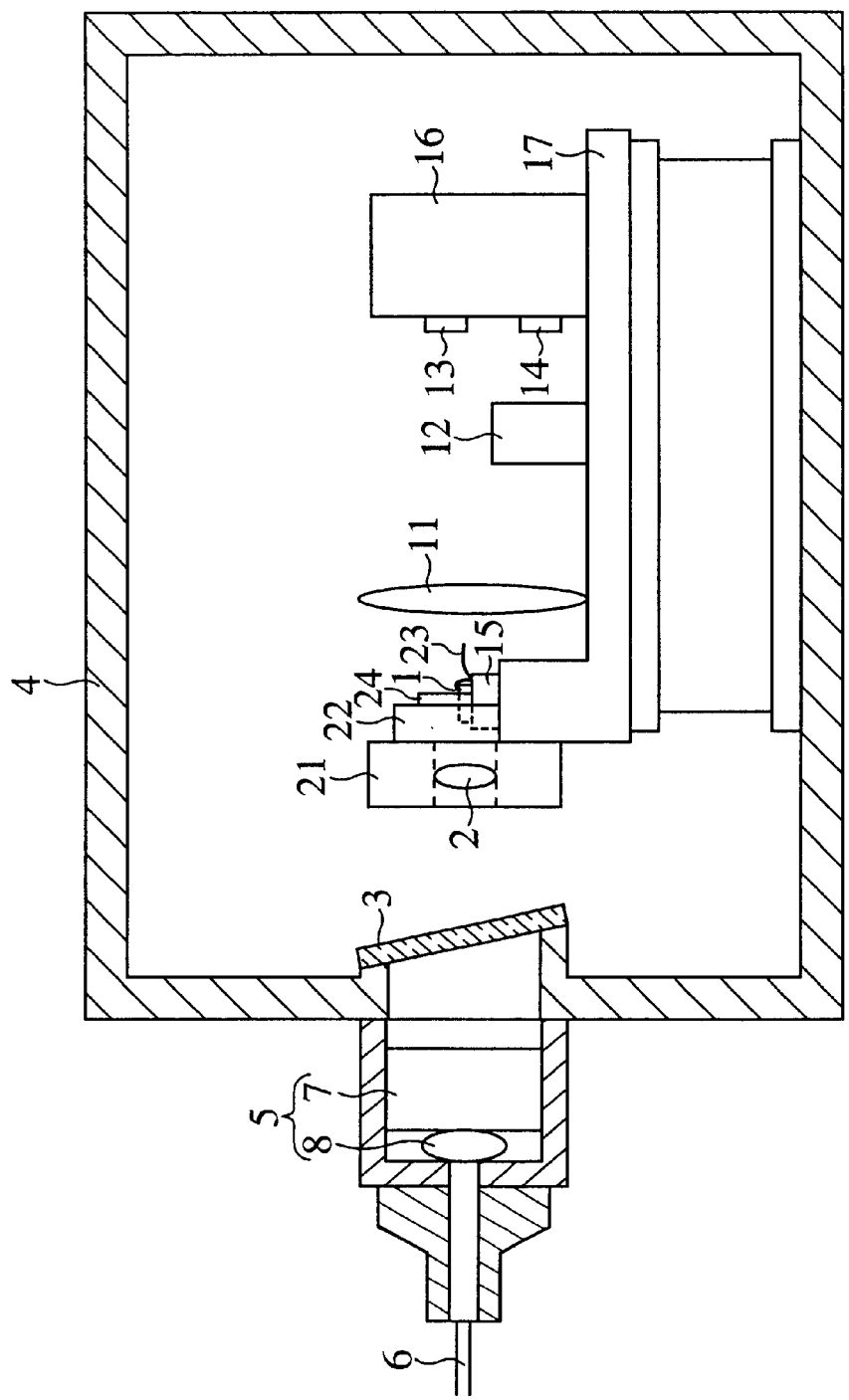
FIG. 1 is a vertical sectional view showing an internal configuration of a semiconductor laser device according to a first embodiment of the present invention.
Figure 2:
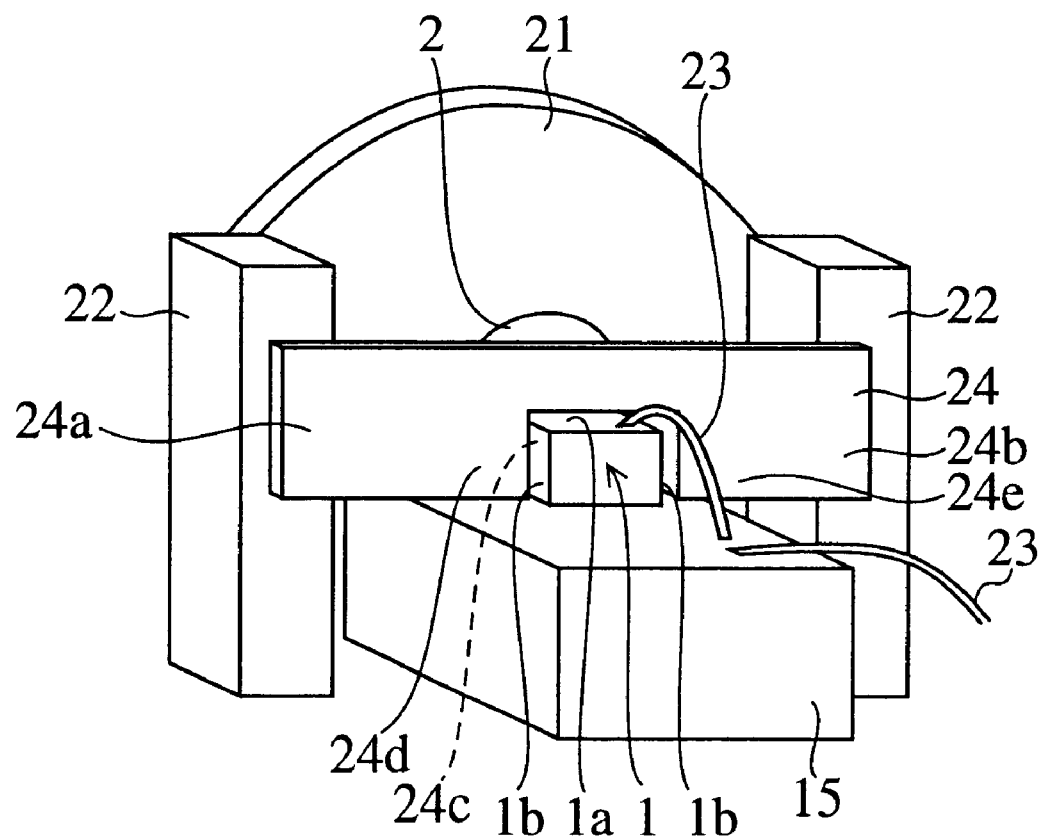
FIG. 2 is a diagonal back view of a semiconductor laser and peripheral members of the semiconductor laser in the semiconductor laser device shown in FIG. 1.

FIG. 1 is a vertical sectional view showing an internal configuration of a semiconductor laser device according to a first embodiment of the present invention. FIG. 2 is a diagonal back view of a semiconductor laser and peripheral members of the semiconductor laser in the semiconductor laser device shown in FIG. 1.

In FIG. 1, 1 indicates a semiconductor laser (hereinafter, called a laser diode) for radiating a forward laser beam for optical communication and radiating a backward laser beam. The laser diode 1 is, for example, formed of a distributed feedback (DFB) type laser having a diffraction grating in an active layer, a wavelength variable laser diode from which a laser beam signal having a wavelength depending on a driving current or temperature is radiated, or a composite semiconductor laser which is composed of an electric absorption device and a laser diode serially arranged. 2 indicates a first lens, arranged in front of the laser diode 1, for collimating the forward laser beam radiated from the laser diode 1. 4 indicates a hermetically-sealed package in which constituent members of the semiconductor laser device are arranged. 3 indicates a package window (or a window) through which the forward laser beam collimated in the first lens 2 is output to the outside of the hermetically-sealed package 4. The package window 3 is arranged in an area placed on a frontal side of the hermetically-sealed package 4.

A part of the forward laser beam collimated in the first lens 2 is reflected on the package window 3. Here, as shown in FIG. 1, to prevent the reflected laser beam from returning to the laser diode 1, the package window 3 is inclined toward an upper direction so as to approach the bottom portion of the package window 3 toward the first lens 2. Therefore, the reflected laser beam is transmitted in an upper direction with respect to an optical axis of laser diode 1.

5 indicates an optical interface unit for leading the forward laser beam collimated in the first lens 2 to the outside of the hermetically-sealed package 4. 6 indicates an optical fiber for receiving the forward laser beam through the optical interface unit 5 and leading the forward laser beam to another device. In the optical interface unit 5, 7 indicates an optical isolator. The forward laser beam collimated in the first lens 2 is sent to the optical fiber 5 through the optical isolator 7 almost without attenuation, and a laser beam returned from the optical fiber 6 is intercepted in the optical isolator 7. 8 indicates an optical fiber coupling lens for converging the forward laser beam transmitted through the optical isolator 7.

11 indicates a second lens, arranged in the rear of the laser diode 1, for converging the backward laser beam radiated from the laser diode 1. 12 indicates a wavelength filter having a wavelength dependence characteristic of transmissivity. A part of the backward laser beam (in this embodiment, an almost lower half part of the backward laser beam) converged in the second lens 11 is received in the wavelength filter 12, intensity of the backward laser beam is changed in the wavelength filter 12 according to a wavelength of the backward laser beam. Therefore, the intensity of the backward laser beam transmitted through the wavelength filter 12 is changed with an oscillation wavelength of the laser diode 1. That is, the wavelength filter 12 has a function for changing the intensity of the backward laser beam at a prescribed rate depending on the wavelength of the backward laser beam.

13 indicates a first photo diode (or a photo detector) for receiving the remaining part of the backward laser beam (in this embodiment, an almost upper half part of the backward laser beam) which is converged in the second lens 11 and is not transmitted through the wavelength filter 12, detecting a light intensity of the remaining part of the backward laser beam as a current value and monitoring the current value. 14 indicates a second photo diode (or a second photo detector) for receiving the almost lower part of the backward laser beam which is converged in the second lens 11 and is transmitted through the wavelength filter 12, detecting a light intensity of the almost lower part of the backward laser beam as a current value and monitoring the current value.

Here, because the light intensity monitored in the first photo diode 13 indicates the intensity of the backward laser beam radiated from the laser diode 1, the first photo diode 13 has a function of a power monitoring photo diode. Also, because the intensity of the backward laser beam transmitted through the wavelength filter 12 depends on the wavelength of the backward laser beam, the light intensity monitored in the second photo diode 14 changes in dependence on the wavelength of the backward laser beam radiated from the laser diode 1. Therefore, the second photo diode 14 has a function of a wavelength monitoring photo diode. A wavelength monitoring device comprises the second lens 11, the wavelength filter 12, the first photo diode 13 and the second photo diode 14.

Also, as shown in FIG. 1 and FIG. 2, 21 indicates a lens holder for holding the first lens 2 so as to surround the first lens 2. 22 indicates each of a pair of lens fixing posts (or a lens fixing member) for fixing the lens holder 21. The lens fixing posts 22 are arranged on the base carrier 17 so as to place the laser diode 1 and the LD carrier 15 between the lens fixing posts 22, and both ends of the lens holder 21 are attached to the lens fixing posts 22 respectively. Each lens fixing post 22 is made of an alloy of copper and tungsten or an alloy of copper, tungsten and nickel. 23 indicates a bonding wire connected with an upper surface 1a of the laser diode 1. An electric power is supplied to the laser diode 1 through the bonding wire 23.

24 indicates a light shielding plate (or a light shielding member) connected with the lens fixing posts 22 on the LD carrier 15 so as to bridge the lens fixing posts 22 through the laser diode 1. The light shielding plate 24 is formed almost in a U shape in a vertical plane perpendicular to the optical axis of the laser diode 1 and extends along a horizontal direction of the vertical plane. Both ends 24a and 24b of the light shielding plate 24 are respectively attached and fixed to the lens fixing posts 22 according to the yttrium-aluminum-garnet (YAG) welding. Also, a cut-out area 24c formed in a rectangular shape is formed in the center of the light shielding plate 24. A frontal portion of the laser diode 1 is inserted into the cut-out area 24c of the light shielding plate 24, and a rear end portion of the laser diode 1 (a portion of the laser diode 1 placed on this side in FIG. 2) is protruded from the cut-out area 24c. A size of the cut-out area 24c is set so as to insert the portion of the laser diode 1 into the cut-out area 24c almost without any space between the laser diode 1 and the cut-out area 24c. The light shielding plate 24 is made of kovar, and all surfaces of the light shielding plate 24 are coated to show a black color. Therefore, the laser beam is not transmitted through or reflected on the light shielding plate 24 but is absorbed in the light shielding plate 24. A thickness of the light shielding plate 24 in a direction of the optical axis of the laser diode 1 is shorter than a length of the laser diode 1 in the optical axis direction, and the upper surface 1a and right and left side surfaces 1b of the laser diode 1 are surrounded by the light shielding plate 24 on the upper and frontal sides of the laser diode 1 to shield the wavelength monitoring device from the reflected laser beam and a scattered laser beam and to prevent the reflected laser beam and the scattered laser beam from transmitting through an upper peripheral area facing the upper surface 1a and side peripheral areas facing the right and left side surfaces 1b of the laser diode 1. Therefore, a length of the light shielding plate 24 in a horizontal direction perpendicular to the optical axis of the laser diode 1 is sufficiently longer than a width of the laser diode 1 in the horizontal direction.

Here, because the width of the light shielding plate 24 in the direction of the optical axis of the laser diode 1 is set to be shorter than the length of the laser diode 1 in the optical axis direction, a non-covered area, in which the upper surface 1a of the laser diode 1 is not covered with the light shielding plate 24, is obtained above the upper surface 1a of the laser diode 1 regardless of whether the light shielding plate 24 is placed above the center of the laser diode 1 or is placed above a frontal portion of the laser diode 1. Therefore, the bonding wire 23 is connected with the upper surface 1a of the laser diode 1 through the non-covered area. Also, an interval between the upper surface 1a of the laser diode 1 and the light shielding plate 24 and an interval between each side surface 1b of the laser diode 1 and the light shielding plate 24 are set as short as possible, and both foot portions 24d and 24e of the light shielding plate 24 (or both end portions of the light shielding plate 24 formed almost in a U shape) are arranged on the LD carrier 15. Also, in cases where the light shielding plate 24 is made of an insulating material or is insulated from the adjacent members such as the lens fixing posts 22, it is applicable that the light shielding plate 24 be in contact with the upper surface 1a or each side surface 1b of the laser diode 1. However, though a light shielding member is soldered to an upper surface of a laser diode in the conventional semiconductor laser device, the light shielding plate 24 is not soldered to the upper surface 1a of the laser diode 1 in this embodiment. An upper portion of the light shielding plate 24 sufficiently extends in an upper direction so as to reliably shield the wavelength monitoring device from the reflected laser beam converged in the first lens 2.

Next, an operation of the semiconductor laser device will be described below.

A backward laser beam radiated from the laser diode 1 is converged in the second lens 11. A lower half part of the backward laser beam converged in the second lens 11 is transmitted through the wavelength filter 12 to reduce the intensity of the lower half part of the backward laser beam according to the wavelength of the backward laser beam, and the lower half part of the backward laser beam is received in the second photo diode 14 to monitor the intensity of the lower half part of the backward laser beam. Also, an upper half part of the backward laser beam converged in the second lens 11 is received in the first photo diode 13 without passing through the wavelength filter 12, and the intensity of the upper half part of the backward laser beam is monitored in the first photo diode 13. Thereafter, the intensity and wavelength of a forward laser beam radiated from the laser diode 1 is adjusted under control of a control circuit (not shown) according to the intensity monitored in the first photo diode 13 and the intensity monitored in the second photo diode 14.

The forward laser beam radiated from the laser diode 1 is collimated in the first lens 2 and is sent to the optical interface unit 5 through the package window 3 arranged in a frontal side area of the hermetically-sealed package 4. In the optical interface unit 5, the forward laser beam collimated in the first lens 2 is transmitted through the optical isolator 7 almost without attenuation and is converged in the optical fiber coupling lens 8. Thereafter, the forward laser beam is coupled to the optical fiber 5. Also, a laser beam returned from the optical fiber 6 is intercepted in the optical isolator 7 to prevent the returned laser beam from entering in the hermetically-sealed package 4 through the package window 3.

In this case, though a most portion of the forward laser beam, which is radiated from the laser diode 1 and is collimated in the first lens 2, is transmitted through the package window 3 and is coupled to the optical fiber 6 through the optical interface unit 5, the remaining portion of the forward laser beam is reflected on the package window 3 as a reflected laser beam. Here, because the package window 3 is arranged so as to be inclined toward the upper direction with respect to the optical axis of the laser diode 1, the laser beam reflected on the package window 3 is converged in the first lens 2, and the reflected laser beam is not returned to a laser beam emitting end surface of the laser beam 1 but is converged at a narrow area placed above the laser diode 1. Assuming that the light shielding plate 24 is not arranged, the reflected laser beam converged at the narrow area is diverged and is received in the photo diodes 13 and 14 of the wavelength monitoring device. However, because the light shielding plate 24 is arranged around the laser diode 1 so as to surround the upper surface 1a and the right and left side surfaces 1b of the laser diode 1, the light shielding plate 24 shields the wavelength monitoring device from the reflected laser beam converged at the narrow area. Therefore, the light shielding plate 24 prevents the reflected laser beam from being transmitted through the upper peripheral area facing the upper surface 1a and the side peripheral areas facing the right and left side surfaces 1b of the laser diode 1.

As is described above, in the first embodiment, the light shielding plate 24 is arranged in both the upper peripheral area facing the upper surface 1a and the side peripheral areas facing the right and left side surfaces 1b of the laser diode 1, and a reflected laser beam is converged at a narrow area included in the first area. Therefore, the light shielding plate 24 can shield the wavelength monitoring device from the reflected laser beam converged at the narrow area to prevent the reflected laser beam from being received in the photo diodes 13 and 14. Accordingly, the intensity and wavelength of the forward laser beam radiated from the laser diode 1 can be correctly and stably adjusted. Also, even though a degree of inclination of the package window 3 changes with a temperature of the hermetically-sealed package 4, because the light shielding plate 24 is widely arranged in the upper and side peripheral areas so as to surround the upper surface 1a and the right and left side surfaces 1b of the laser diode 1, the light shielding plate 24 can reliably shield the wavelength monitoring device from the reflected laser beam still converged in the upper and side peripheral areas.

Also, in the first embodiment, the soldering of the light shielding plate 24 to the upper surface 1a of the laser diode 1 is not adopted. That is, the light shielding plate 24 is arranged around the laser diode 1 on the upper and frontal sides of the laser diode 1 so as to surround the upper surface 1a and the right and left side surfaces 1b of the laser diode 1, and both the ends of the light shielding plate 24 are fixed to the lens fixing posts 22 respectively. Therefore, the bonding wire 23 can be reliably connected with a rear portion of the upper surface 1a of the laser diode 1 through a non-covered area in which the upper surface 1a of the laser diode 1 is not covered with the light shielding plate 24. Accordingly, the light shielding plate 24 can reliably shield the wavelength monitoring device from the reflected laser beam without giving an adverse influence of the light shielding plate 24 on a driving current supplied to the laser diode 1 through the bonding wire 23.

Here, the reflected laser beam is once converged above the laser diode 1 and is again diverged. Therefore, in cases where the photo diodes 13 and 14 are placed near to the laser diode 1 just on the rear side of a backward laser beam emitting point of the laser diode 1, even though the light shielding plate 24 is not arranged, there is little probability that the reflected laser beam again diverged is incident on the photo diodes 13 and 14. However, in cases where the laser diode 1 is placed at a position apart from the photo diodes 13 and 14 without arranging the light shielding plate 24, there is a high probability that the reflected laser beam is diverged and is incident on the photo diodes 13 and 14. Therefore, in cases where the second lens 11 and the wavelength filter 12 are arranged between the laser diode 1 and the group of photo diodes 13 and 14 so as to place the laser diode 1 at a position apart from the photo diodes 13 and 14, the light shielding plate 24 can effectively shield the photo diodes 13 and 14 from the reflected laser beam.

In the first embodiment, the light shielding plate 24 is attached and fixed to the lens fixing posts 22. However, it is not necessary to fix the light shielding plate 24 to the lens fixing posts 22. For example, because the foot portions 24d and 24e of the light shielding plate 24 are mounted on the LD carrier 15, in cases where a metallic portion of the LD carrier 15 is exposed, it is applicable that the light shielding plate 24 be attached and fixed to the metallic portion of the LD carrier 15 according to the YAG welding. Also, in cases where the LD carrier 15 is a substrate, the light shielding plate 24 is soldered to the LD carrier 15. Also, the bonding wire 23 is connected to a rear portion of the upper surface 1a of the laser diode 1. However, it is applicable that the bonding wire 23 be connected to a frontal portion of the upper surface 1a of the laser diode 1 while getting over the light shielding plate 24.

Also, in the first embodiment, the light shielding plate 24 is formed almost in a U shape, and the foot portions 24d and 24e of the light shielding plate 24 are mounted on the LD carrier 15. However, the first embodiment is not limited to the light shielding plate 24 mounted on the LD carrier 15.

Figure 3:
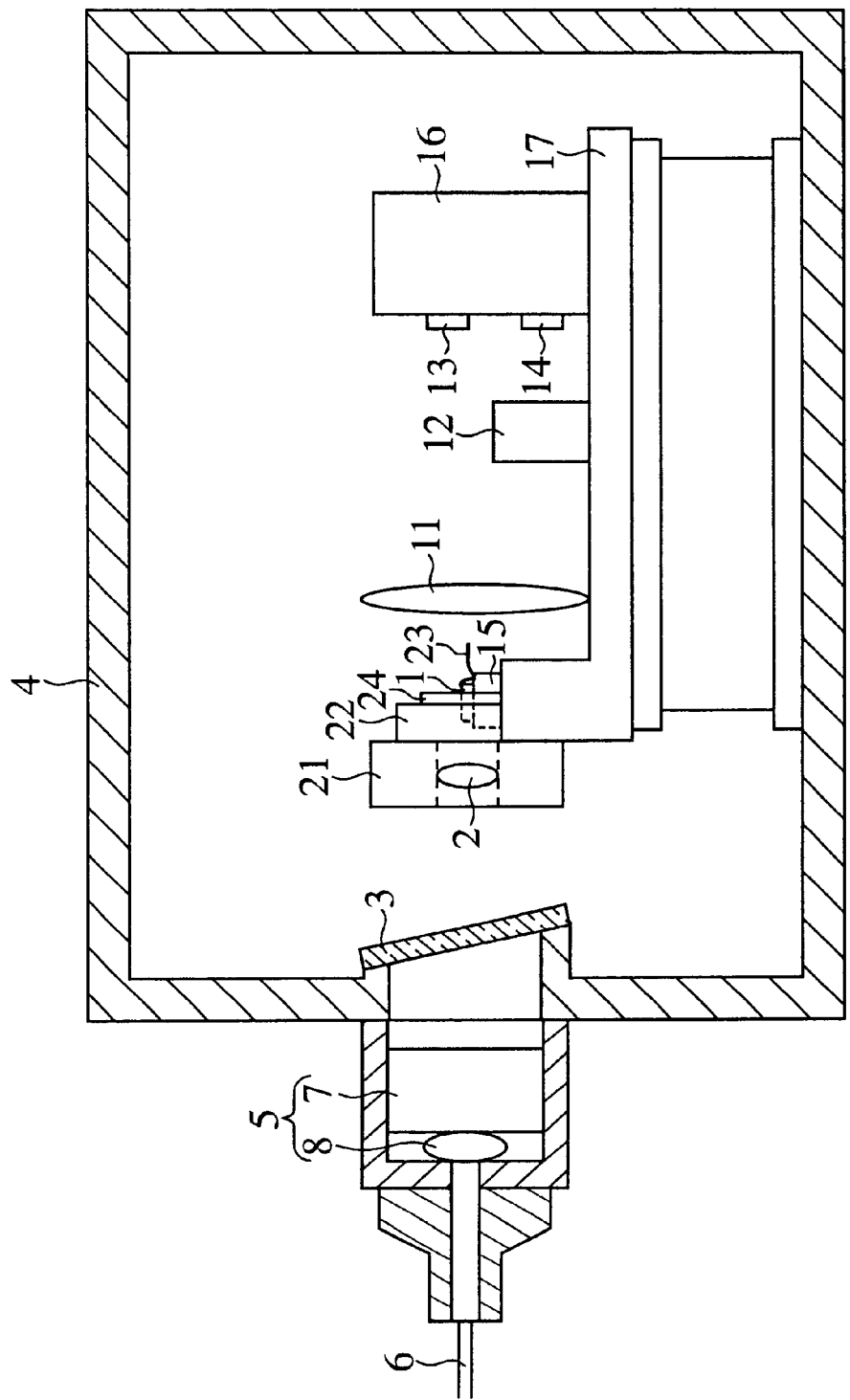
FIG. 3 is a vertical sectional view showing an internal configuration of a semiconductor laser device according to a first modification of the first embodiment.
Figure 4:
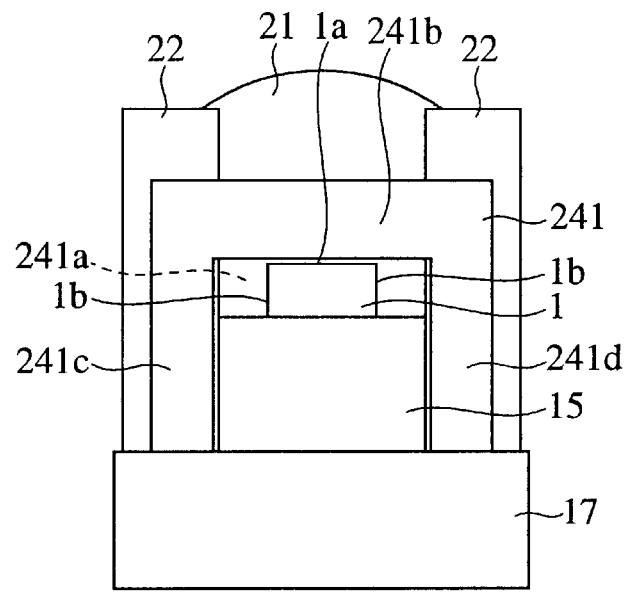
FIG. 4 is a back view of a semiconductor laser and peripheral members of the semiconductor laser in the semiconductor laser device shown in FIG. 3.

FIG. 3 is a vertical sectional view showing an internal configuration of a semiconductor laser device according to a first modification of the first embodiment. FIG. 4 is a back view of a semiconductor laser and peripheral members of the semiconductor laser in the semiconductor laser device shown in FIG. 3. The constituent elements, which are the same as those shown in FIG. 1, are indicated by the same reference numerals as those of the constituent elements shown in FIG. 1, and additional description of those constituent elements is omitted.

In FIG. 3 and FIG. 4, 241 indicates a light shielding plate formed almost in a U shape. A cut-out area 241a formed in a rectangular shape is surrounded by the light shielding plate 241, and a portion of the laser diode 1 and a portion of the LD carrier 15 are inserted into the cut-out area 241a so as to place a central portion 241b of the light shielding plate 241 on the laser diode 1. Both foot portions 241c and 241d of the light shielding plate 241 are mounted on the base carrier 17. An interval between the light shielding plate 241 and the upper surface 1a of the laser diode 1 is set as short as possible. However, it is applicable that the light shielding plate 241 be closely adjacent to the upper surface 1a of the laser diode 1.

Therefore, the light shielding plate 241 can shield the wavelength monitoring device from the reflected laser beam converged above the upper surface 1a of the laser diode 1, and the reflected laser beam is absorbed by the light shielding plate 241.

In the first modification of the first embodiment, the foot portions 241c and 241d of the light shielding plate 241 are attached and fixed to the lens fixing posts 22. However, because the foot portions 241c and 241d of the light shielding plate 241 are mounted on the base carrier 17, it is applicable that the light shielding plate 241 be attached and fixed to the base carrier 17 according to the YAG welding.

Figure 5:
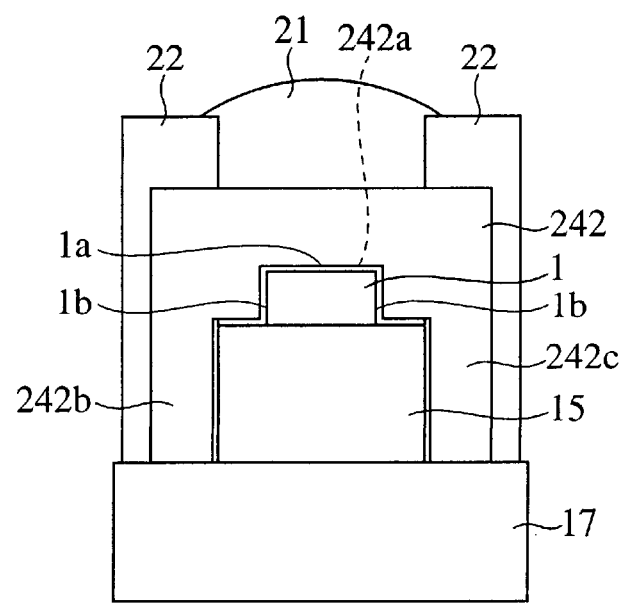
FIG. 5 is a back view of a semiconductor laser and peripheral members of the semiconductor laser in a semiconductor laser device according to a second modification of the first embodiment.

FIG. 5 is a back view of a semiconductor laser and peripheral members of the semiconductor laser in a semiconductor laser device according to a second modification of the first embodiment. The constituent elements, which are the same as those shown in FIG. 1 or FIG. 2, are indicated by the same reference numerals as those of the constituent elements shown in FIG. 1 or FIG. 2, and additional description of those constituent elements is omitted.

In FIG. 5, 242 indicates a light shielding plate formed almost in a U shape. A cut-out area 242a formed in a stepladder shape is surrounded by the light shielding plate 242, and a portion of the laser diode 1 and a portion of the LD carrier 15 are inserted into the cut-out area 242a so as to set a space between the light shielding plate 242 and the group of the LD carrier 15 and the laser diode 1 mounted on the LD carrier 15 as small as possible. That is, the upper surface 1a and the right and left side surfaces 1b of the laser diode 1 are surrounded by the light shielding plate 242, both foot portions 242b and 242c of the light shielding plate 242 extend toward the lower direction along both side surfaces of the LD carrier 15 and are attached to an upper surface of the base carrier 17. Therefore, a frontal area placed in front of the laser diode 1 is separated from the wavelength monitoring device placed in the rear of the laser diode 1 by the light shielding plate 242.

Accordingly, the light shielding plate 242 can prevent the reflected laser beam converged at the frontal area of the laser diode 1 and a scattered laser beam derived from the reflected laser beam from being transmitted to the wavelength filtering device, and the reflected laser beam and the scattered laser beam are absorbed by the light shielding plate 242. That is, the light shielding plate 242 can further reliably shield the photo diodes 13 and 14 from the reflected laser beam and the scattered laser beam.

In the semiconductor laser devices shown in FIG. 1 and FIG. 2, the package window 3 is inclined toward the upper direction with respect to the optical axis of the laser diode 1. However, the first embodiment is not limited to the package window 3 inclined toward the upper direction.

Figure 6:
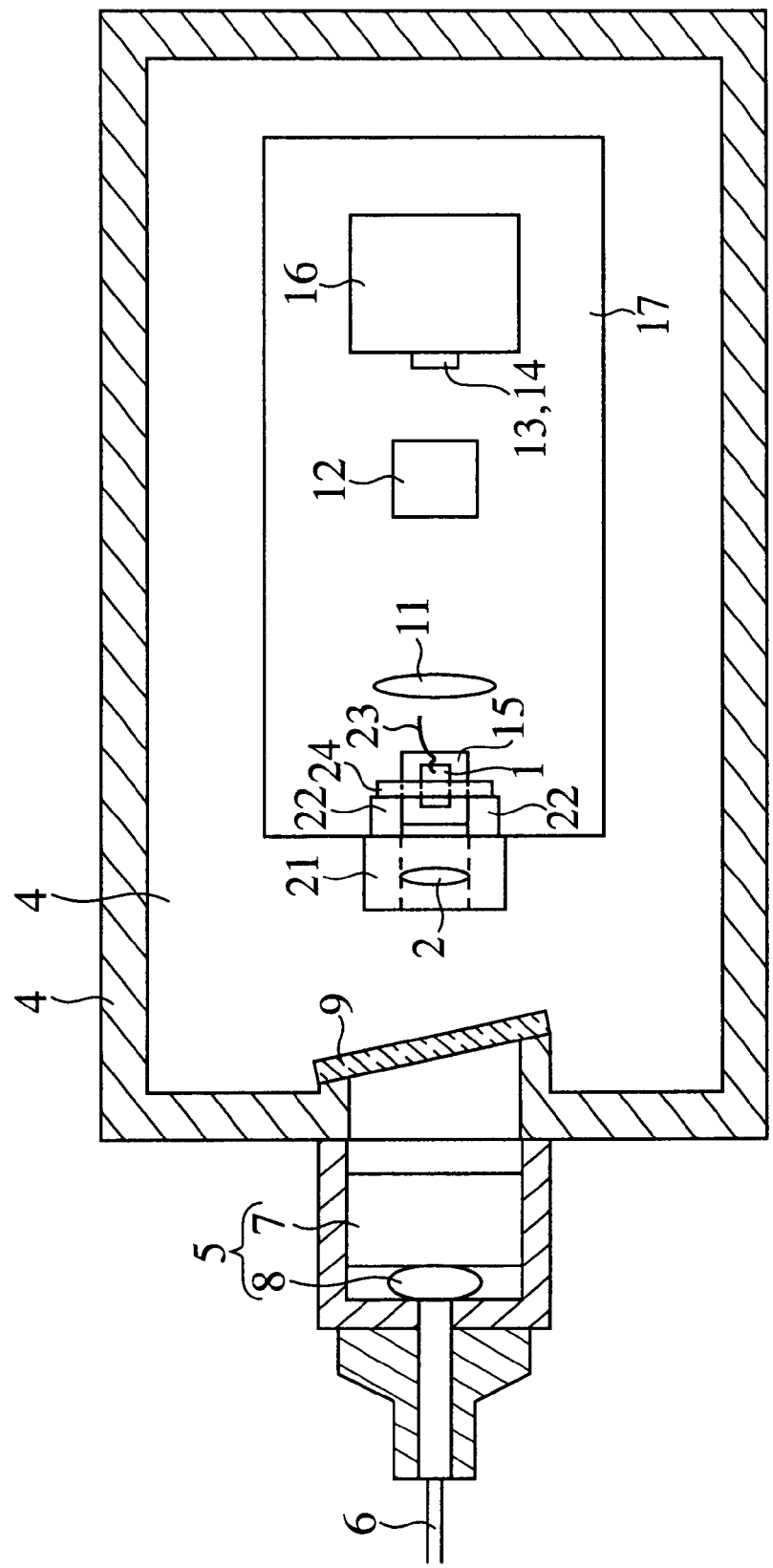
FIG. 6 is a cross-sectional top view showing an internal configuration of a semiconductor laser device according to a third modification of the first embodiment.

FIG. 6 is a cross-sectional top view showing an internal configuration of a semiconductor laser device according to a third modification of the first embodiment. The constituent elements, which are the same as those shown in FIG. 1 or FIG. 2, are indicated by the same reference numerals as those of the constituent elements shown in FIG. 1 or FIG. 2, and additional description of those constituent elements is omitted.

In FIG. 6, 9 indicates a package window (or a window) for transmitting the forward laser beam collimated in the first lens 2. The package window 9 is arranged in a frontal side area of the hermetically-sealed package 4, and the package window 9 is inclined toward a right or left side direction with respect to the optical axis of the laser diode 1. Therefore, the forward laser beam is not incident on the package window 9 at right angles to the package window 9.

A laser beam reflected on the package window 9 is transmitted through the first lens 2 so as to be converged at a narrow area placed on the right or left side (or an upper side in FIG. 6) of the laser diode 1. In the semiconductor laser device according to the third modification of the first embodiment, the light shielding plate 24 shown in FIG. 1 and FIG. 2 is arranged so as to surround the upper surface 1a and the right and left side surfaces 1b of the laser diode 1 in the same manner as in the first embodiment. Therefore, the light shielding plate 24 can reliably shield the wavelength monitoring device from the reflected laser beam converged on the right or left side of the laser diode 1, and the reflected laser beam can be reliably absorbed by the light shielding plate 24.

Accordingly, the light shielding plate 24 can reliably prevent the reflected laser beam and a scattered laser beam derived from the reflected laser beam from being received in the photo diodes 13 and 14.

Here, it is applicable that the package window 9 be inclined toward any direction with respect to the optical axis of the laser diode 1 on condition that the reflected laser beam is returned to a narrow area placed in the neighborhood of the laser diode 1. Therefore, it is applicable that the package window 9 be inclined toward an upper, lower, right or left direction with respect to the optical axis of the laser diode 1.

Embodiment 2

Figure 7:
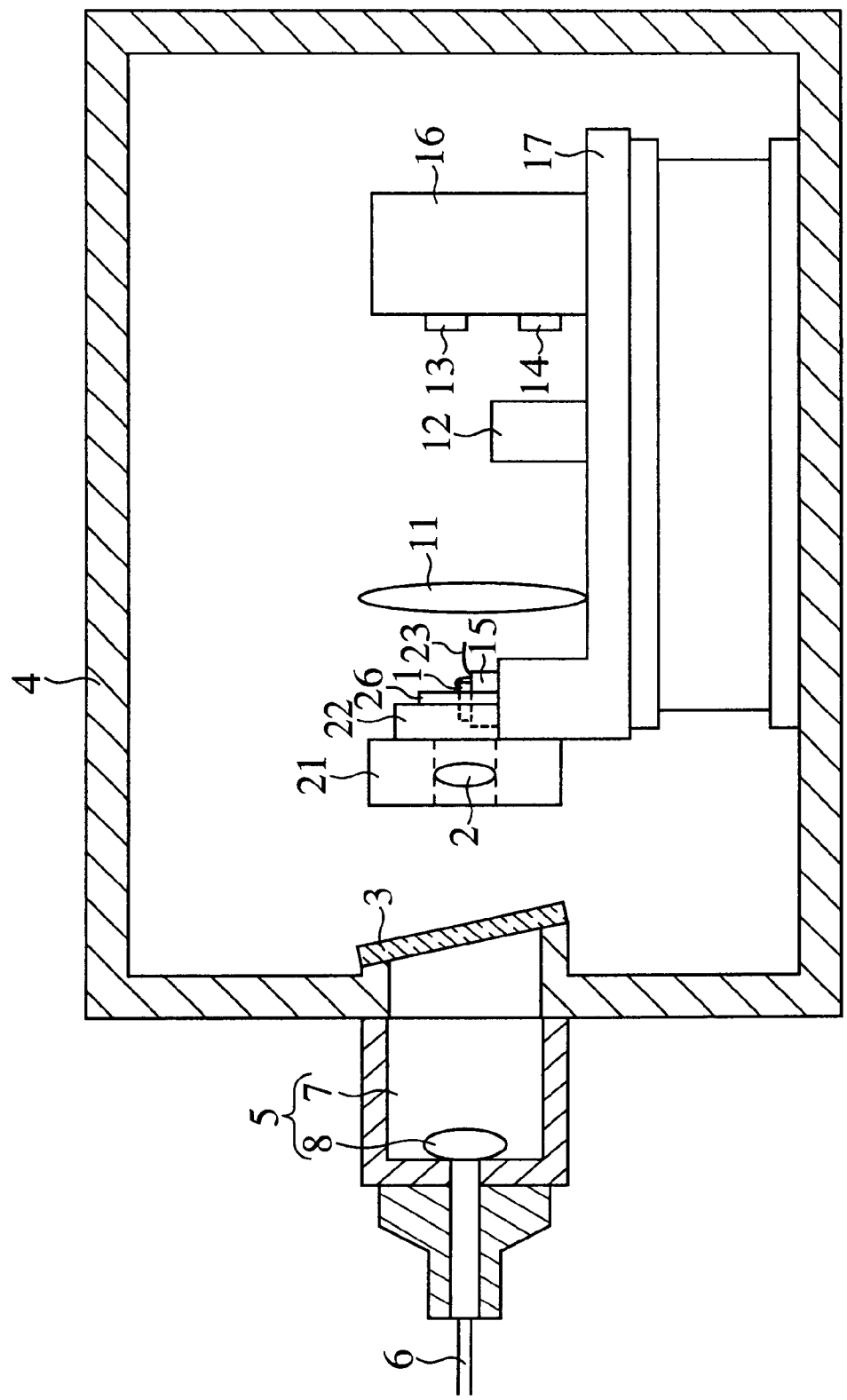
FIG. 7 is a vertical sectional view showing an internal configuration of a semiconductor laser device according to a second embodiment of the present invention.
Figure 8:
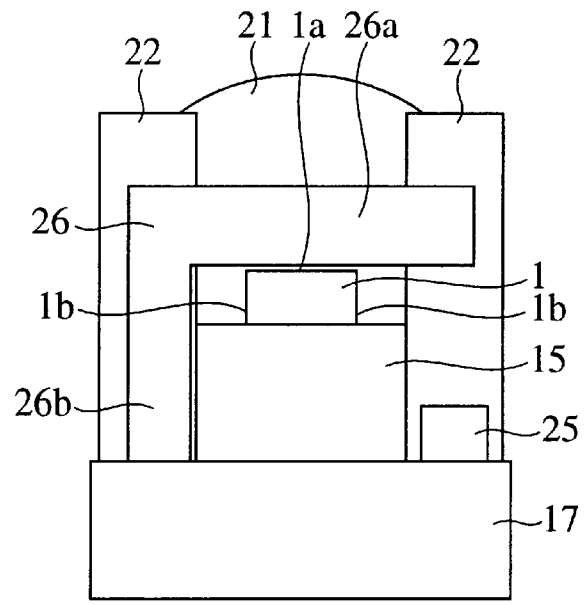
FIG. 8 is a back view of a semiconductor laser and peripheral members of the semiconductor laser in the semiconductor laser device shown in FIG. 7.

FIG. 7 is a vertical sectional view showing an internal configuration of a semiconductor laser device according to a second embodiment of the present invention. FIG. 8 is a back view of a semiconductor laser and peripheral members of the semiconductor laser in the semiconductor laser device shown in FIG. 7. The constituent elements, which are the same as those of the first embodiment, are indicated by the same reference numerals as those of the constituent elements of the first embodiment, and additional description of those constituent elements is omitted.

In FIG. 7 and FIG. 8, 25 indicates a functional member such as a circuit substrate for high frequency, an electric current feeding and modulating circuit (a resistor or a capacitor), a thermister or a micro-strip line. The functional member 25 is placed on one side of the LD carrier 15 and is arranged on an upper surface of the base carrier 17. 26 indicates a light shielding plate (or a light shielding member) connected with the lens fixing posts 22 on the LD carrier 15 so as to bridge the lens fixing posts 22 through the laser diode 1. The light shielding plate 26 is formed almost in an L shape in a vertical plane perpendicular to the optical axis of the laser diode 1, a horizontal portion 26a of the light shielding plate 26 extends along a horizontal direction of the vertical plane, and a foot portion 26b of the light shielding plate 26 extends along a vertical direction of the vertical plane. The horizontal portion 26a of the light shielding plate 26 is attached and fixed to the lens fixing posts 22 according to the YAG welding, and the foot portion 26b of the light shielding plate 26 is attached and fixed to the corresponding lens fixing post 22 according to the YAG welding. The light shielding plate 26 is made of kovar, and all surfaces of the light shielding plate 26 are coated to show a black color. Therefore, the laser beam is not transmitted through or reflected on the light shielding plate 26 but is absorbed in the light shielding plate 26. A thickness of the light shielding plate 26 in a direction of the optical axis of the laser diode 1 is shorter than a length of the laser diode 1 in the optical axis direction, and the upper surface 1a and the right or left side surface 1b of the laser diode 1 are surrounded by the light shielding plate 26 on the upper and frontal sides of the laser diode 1 to shield the wavelength monitoring device from the reflected laser beam and a scattered laser beam transmitted through upper, right and left side areas of the laser diode 1. Therefore, a length of the horizontal portion 26a of the light shielding plate 26 in a horizontal direction perpendicular to the optical axis of the laser diode 1 is sufficiently longer than a width of the laser diode 1 in the horizontal direction.

Here, because the width of the light shielding plate 26 in the direction of the optical axis of the laser diode 1 is set to be shorter than the length of the laser diode 1 in the optical axis direction, a non-covered area, in which the upper surface 1a of the laser diode 1 is not covered with the light shielding plate 26, is obtained above the upper surface 1a of the laser diode 1 regardless of whether the light shielding plate 26 is placed above the center of the laser diode 1 or is placed above a frontal portion of the laser diode 1. Therefore, the bonding wire 23 is connected with the upper surface 1a of the laser diode 1 through the non-covered area. Also, an interval between the upper surface 1a of the laser diode 1 and the horizontal portion 26a of the light shielding plate 26 is set to be as shorter as possible, and the foot portion 26b of the light shielding plate 26 is arranged on the base carrier 17 on one side opposite to another side of the LD carrier 15 on which the functional member 25 is arranged on the base carrier 17. In other words, the functional member 25 is arranged on one side of the laser diode 1, and the foot portion 26b of the light shielding plate 26 is arranged on the other side of the laser diode 1. In this case, it is applicable that the light shielding plate 26 be in contact with the upper surface 1a of the laser diode 1. An upper portion of the light shielding plate 26 sufficiently extends in an upper direction so as to reliably shield the wavelength monitoring device from the reflected laser beam transmitted through the first lens 2.

In cases where the functional member 25 is arranged on the base carrier 17, it is impossible to arrange the U-shaped light shielding plate 241 shown in FIG. 4 in the semiconductor laser device. Therefore, in the second embodiment, the light shielding plate 26 formed in an L shape is arranged in the semiconductor laser device to avoid coming in contact with the functional member 25.

In the above configuration, in the same manner as in the semiconductor laser device using the light shielding plate 24, 241 or 242, the light shielding plate 26 shields the wavelength monitoring device from the reflected laser beam converged at a narrow area above the laser diode 1.

As is described above, in the second embodiment, in cases where a member (for example, the functional member 25) arranged in the semiconductor laser device is arranged on the base carrier 17, because the reflected laser beam is converged at a narrow area of an upper peripheral area facing the upper surface 1a of the laser diode 1, the light shielding plate 26 formed in an L shape is arranged in both the upper peripheral area and side peripheral areas facing the right or left side surface 1b of the laser diode 1 so as not to occupy an area of the functional member 25. Therefore, the light shielding plate 26 can reliably shield the wavelength monitoring device from the reflected laser beam converged at the narrow area above the laser diode 1, and the reflected laser beam can be reliably absorbed in the light shielding plate 26. Accordingly, the light shielding plate 26 can reliably prevent the reflected laser beam from being received in the photo diodes 13 and 14.

Also, even though a degree of inclination of the package window 3 changes with a temperature of the hermetically sealed package 4, because the light shielding plate 26 is widely arranged in the upper and side peripheral areas so as to surround the upper surface 1a and the right or left side surface 1b of the laser diode 1, the reflected laser beam is still converged in the upper and side peripheral areas, and the light shielding plate 26 can reliably shield the wavelength monitoring device from the reflected laser beam. Accordingly, the intensity and wavelength of the forward laser beam can be correctly adjusted.

Also, in the second embodiment, the soldering of the light shielding plate 26 to the upper surface 1a of the laser diode 1 is not adopted. That is, the light shielding plate 26 is arranged around the laser diode 1 on the upper and frontal sides of the laser diode 1 so as to surround the upper surface 1a and the right or left side surface 1b of the laser diode 1, and the light shielding plate 26 is fixed to the lens fixing posts 22. Therefore, the bonding wire 23 can be reliably connected with the rear portion of the upper surface 1a of the laser diode 1 through a non-covered area in which the upper surface 1a of the laser diode 1 is not covered with the light shielding plate 26. Accordingly, the light shielding plate 26 can reliably shield the wavelength monitoring device from the reflected laser beam without giving an adverse influence of the light shielding plate 26 on a driving current supplied to the laser diode 1 through the bonding wire 23.

In the second embodiment, the light shielding plate 26 is attached and fixed to the lens fixing posts 22. However, it is not necessary to fix the light shielding plate 26 to the lens fixing posts 22. For example, because the foot portion 26d of the light shielding plate 26 is mounted on the base carrier 17, it is applicable that the light shielding plate 26 be attached and fixed to the base carrier 17 according to the YAG welding.

Embodiment 3

Figure 9:
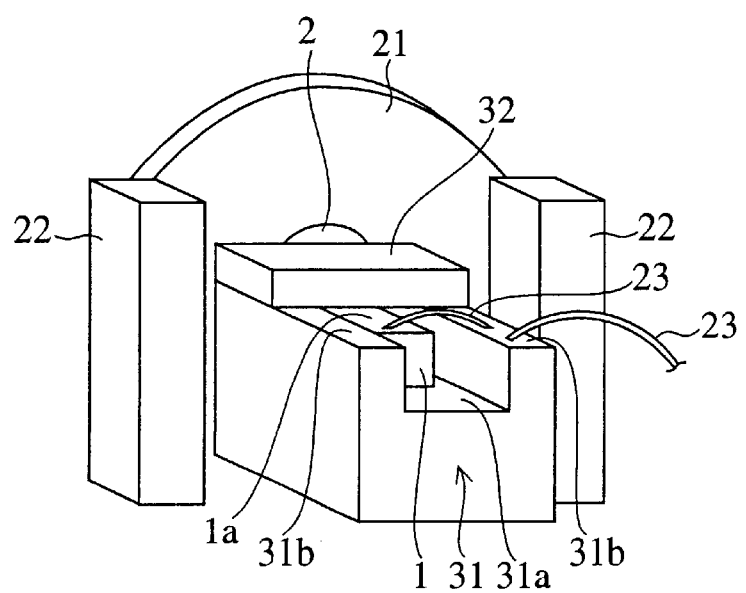
FIG. 9 is a diagonal back view of a semiconductor laser and peripheral members of the semiconductor laser in a semiconductor laser device according to a third embodiment of the present invention.
Figure 10:
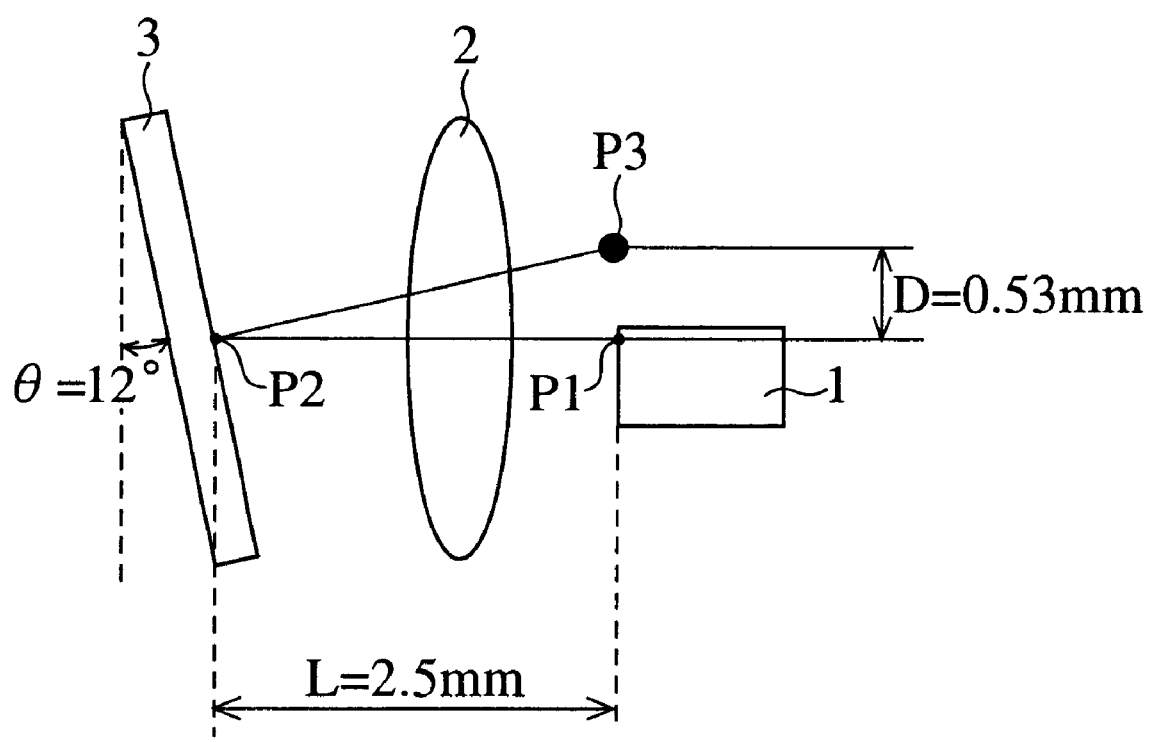
FIG. 10 is an explanatory view of a position at which a reflected laser beam of the semiconductor laser device shown in FIG. 9 is converged.

FIG. 9 is a diagonal back view of a semiconductor laser and peripheral members of the semiconductor laser in a semiconductor laser device according to a third embodiment of the present invention. FIG. 10 is an explanatory view of a position at which the reflected laser beam of the semiconductor laser device shown in FIG. 9 is converged. Because the configuration of the semiconductor laser device is fundamentally the same as that shown in FIG. 1, the constituent elements, which are the same as those shown in FIG. 1, are indicated by the same reference numerals as those of the constituent elements shown in FIG. 1, and additional description of those constituent elements is omitted.

In FIG. 9, 31 indicates an LD carrier. A slot 31a extending in a direction of the optical axis of the laser diode 1 is formed on the upper side of the LD carrier 31. The laser diode 1 is arranged in the slot 31a of the LD carrier 31, and the laser diode 1 is, for example, soldered to the LD carrier 31. A depth of the slot 31a is equal to or higher than a height of the laser device 1. For example, a difference between the depth of the slot 31a and the height of the laser device 1 is sufficiently lower than 0.53 mm. 32 indicates a light shielding body (a light shielding member) formed in a rectangular prism. The light shielding body 32 is placed on upper surfaces 31b of the LD carrier 31 so as to straddle the slot 31a of the LD carrier 31. The light shielding body 32 is obtained by attaching a film of an alloy made of titanium and gold to all surfaces of an alloy plate of copper and tungsten. Therefore, a laser beam is not transmitted through the light shielding body 32 but is reflected or absorbed on/in the light shielding body 32. The light shielding body 32 is, for example, soldered to the upper surfaces 31b of the LD carrier 31. A width of the light shielding body 32 in a direction of the optical axis of the laser diode 1 is set to be shorter than a length of the laser diode 1 in the optical axis direction, and the light shielding body 32 is arranged to cover a frontal area (or an area near to the package window 3) of the upper surface 1a of the laser diode 1. Therefore, the light shielding body 32 does not cover a rear area of the upper surface 1a of the laser diode 1, and the bonding wire 23 is connected with the upper surface 1a of the laser diode 1 through a non-covered area in which the light shielding body 32 is not arranged. Also, because the light shielding body 32 straddles the slot 31a of the LD carrier 31 in which the laser diode 1 is arranged, a length of the light shielding body 32 in a direction perpendicular to a direction of the optical axis of the laser diode 1 in a horizontal plane(or a plane parallel to the upper surface 1a of the laser diode 1) is sufficiently longer than a width of the laser diode 1 in the direction.

Next, a position, at which the reflected laser beam is converged, is described with reference to FIG. 10.

As shown in FIG. 10, a distance L between a forward laser beam emitting point P1 of the laser diode 1 and an incident point P2 of the center of the forward laser beam on the package window 3 is set to 2.5 mm, and an inclination angle θ of the package window 3 toward the upper direction is set to 12 degrees. In this case, the reflected laser beam is converged at a focal position P3 just above the emitting point P1, and the height of the focal position P3 is higher than the incident point P2 by D=0.53 mm (D=L×tan θ). That is, the reflected laser beam is converged at the focal position P3 and is diverged. Therefore, it is preferred that the light shielding body 32 shields the wavelength monitoring device from the reflected laser beam at the focal position P3. In this case, a small-sized light shielding body 32 can be used.

In the third embodiment, because the light shielding body 32 is arranged on the upper surfaces 31b of the LD carrier 31, the position of the light shielding body 32 in the direction of the optical axis of the laser diode 1 can be arbitrarily set. That is, though the positions of the light shielding plates 24, 241, 242 and 26 of the first and second embodiments in the direction of the optical axis are limited by the lens fixing posts 22, the position of the light shielding body 32 in the direction of the optical axis is not substantially limited. Therefore, it is easy to arrange the light shielding body 32 on the LD carrier 31 so as to place a frontal surface of the light shielding body 32 facing the first lens 2 at the focal position P3. Also, the height of the light shielding body 32 relative to the laser diode 1 can be arbitrarily set by adjusting the depth of the slot 31a of the LD carrier 31. Therefore, the depth of the slot 31a of the LD carrier 31 is set so as to place the center of the frontal surface of the light shielding body 32 facing the first lens 2 at the focal position P3.

In the above configuration, the forward laser beam reflected on the package window 3 is transmitted through the first lens 2 and is converged at the focal position P3 placed above the laser diode 1. Therefore, the light shielding body 32 shields the wavelength monitoring device from the reflected laser beam converged above the laser diode 1, and the reflected laser beam is absorbed in the light shielding body 32. Accordingly, the light shielding body 32 prevents the reflected laser beam from being received in the photo diodes 13 and 14.

As is described above, in the third embodiment, the slot 31a is formed on the upper side of the LD carrier 31, the laser diode 1 is arranged in the slot 31a of the LD carrier 31, and the light shielding body 32 is arranged on the upper surfaces 31b of the LD carrier 31. Therefore, the position of the light shielding body 32 relative to the laser diode 1 can be arbitrarily set on condition that the light shielding body 32 is attached to the upper surfaces 31b of the LD carrier 31. Because the position of the light shielding body 32 can be arbitrarily set, the light shielding body 32 is positioned so as to place the center of the frontal surface of the light shielding body 32 at the focal position P3 of the reflected laser beam. Accordingly, the light shielding body 32 can reliably shield the wavelength monitoring device from the reflected laser beam converged at the focal position P3, and the light shielding body 32 can reliably prevent the reflected laser beam from being received in the photo diodes 13 and 14. Also, even though a degree of inclination of the package window 3 changes with a temperature of the hermetically-sealed package 4, because the light shielding body 32 is widely arranged, the light shielding body 32 can reliably shield the wavelength monitoring device from the reflected laser beam. Accordingly, the intensity and wavelength of the forward laser beam can be correctly and reliably adjusted. That is, an automatic power control can be accurately performed for the laser diode 1.

Also, in the third embodiment, the light shielding body 32 does not cover the whole surface 1a of the laser diode 1 but covers only the frontal area of the surface 1a of the laser diode 1. Therefore, a non-covered area not covered with the light shielding body 32 is obtained in the rear area of the surface 1a of the laser diode 1, and the bonding wire 23 can be reliably connected with the non-covered area of the surface 1a of the laser diode 1. Accordingly, the light shielding body 32 can reliably shield the wavelength monitoring device from the reflected laser beam without giving an adverse influence of the light shielding body 32 on a driving current supplied to the laser diode 1 through the bonding wire 23.

Also, in the third embodiment, side peripheral areas facing the right and left side surfaces 1b of the laser diode 1 are covered with upper projecting portions of the LD carrier 31 surrounding the laser diode 1. Therefore, there is no possibility that a scattered laser beam is transmitted through the side peripheral areas facing the right and left side surfaces 1b of the laser diode 1 and is received in the photo diode 13 or 14.

Embodiment 4

Figure 11:
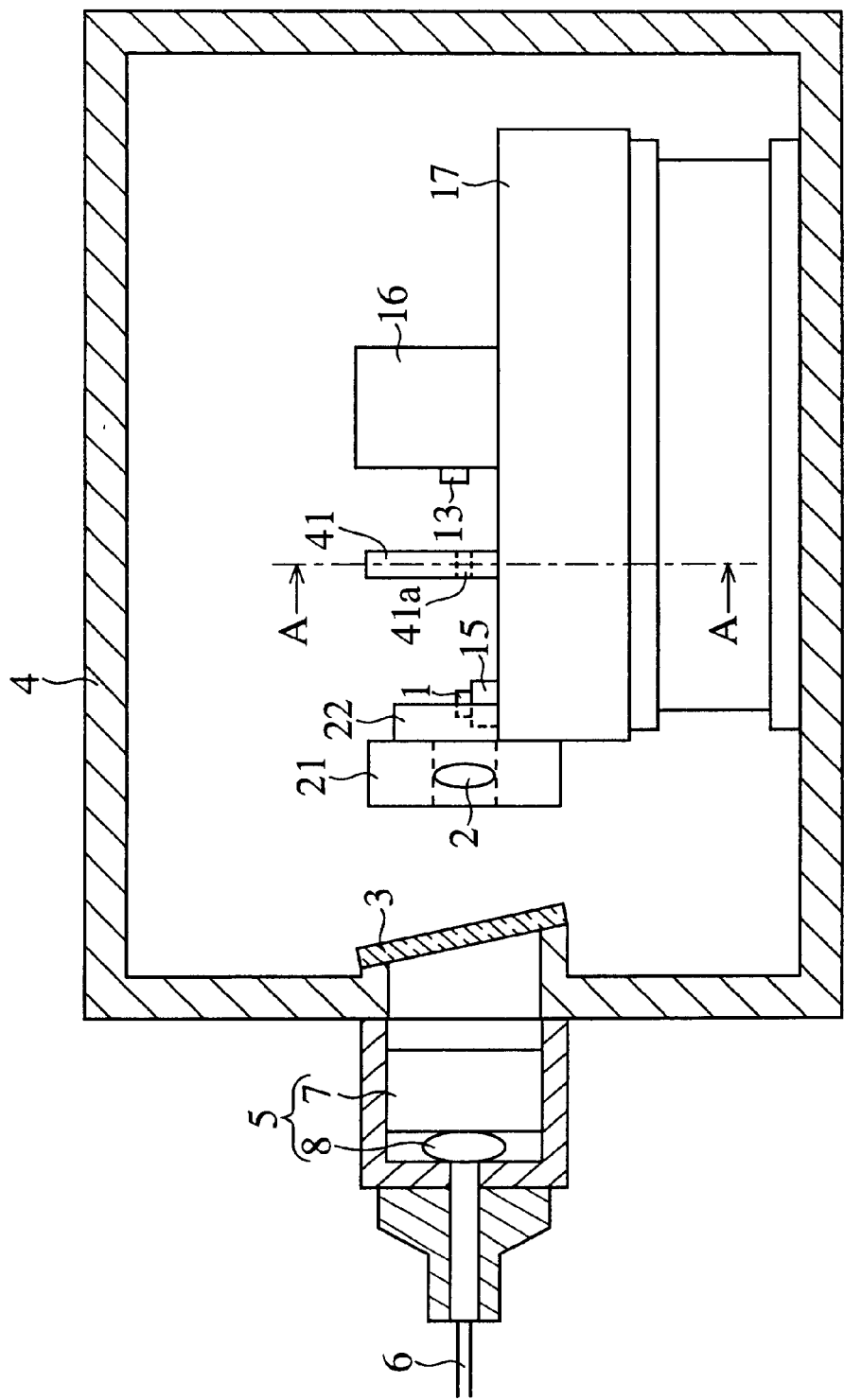
FIG. 11 is a vertical sectional view showing an internal configuration of a semiconductor laser device according to a fourth embodiment of the present invention.
Figure 12:
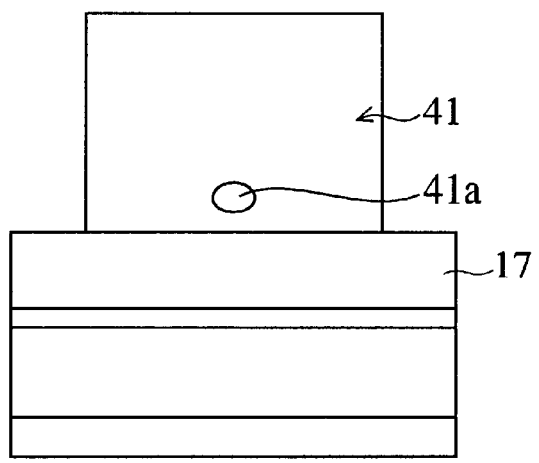
FIG. 12 is a sectional view taken substantially along line A—A of FIG. 11.
Figure 13:
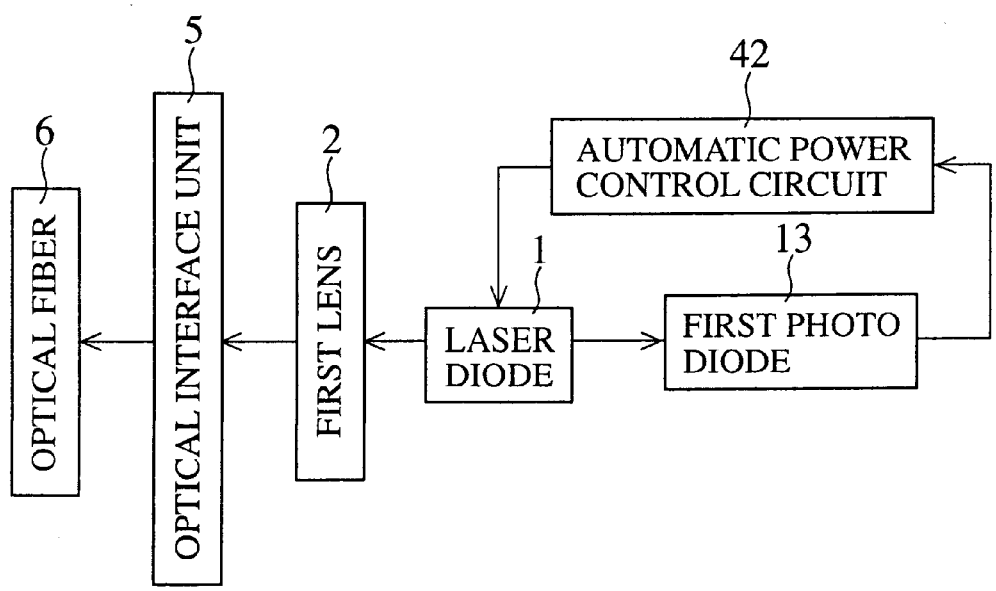
FIG. 13 is a block diagram of the semiconductor laser device according to the fourth embodiment.

FIG. 11 is a vertical sectional view showing an internal configuration of a semiconductor laser device according to a fourth embodiment of the present invention. FIG. 12 is a sectional view taken substantially along line A—A of FIG. 11. FIG. 13 is a block diagram of the semiconductor laser device according to the fourth embodiment. The constituent elements, which are the same as those shown in FIG. 1 or FIG. 2, are indicated by the same reference numerals as those of the constituent elements shown in FIG. 1 or FIG. 2, and additional description of those constituent elements is omitted.

In FIG. 11 and FIG. 12, 41 indicates a light shielding plate (or a light shielding member) arranged between the laser diode 1 and the first photo diode 13 on the base carrier 17. The light shielding plate 41 widely extends in a plane orthogonal to the optical axis of the laser diode 1. That is, a width of the light shielding plate 41 in a direction perpendicular to the optical axis of the laser diode 1 in a horizontal plane is set to be sufficiently longer than a width of the laser diode 1 in the direction, and a height of the light shielding plate 41 is sufficiently higher than that of the laser diode 1. The light shielding plate 41 is made of kovar, and all surfaces of the light shielding plate 41 are coated to show a black color. Therefore, the laser beam is not transmitted through or reflected on the light shielding plate 41 but is absorbed in the light shielding plate 41. The light shielding plate 41 is soldered to the base carrier 17. Also, a through hole 41a is formed at a low position of the light shielding plate 41, and the optical axis of the laser diode 1 crosses the light shielding plate 41 at the through hole 41a. Therefore, the backward laser beam radiated from the laser diode 1 is transmitted through the through hole 41a of the light shielding plate 41 and is received in the first photo diode 13, and the intensity of the backward laser beam is monitored in the first photo diode 13. Also, the bonding wire 23 (not shown) is connected with the upper surface 1a of the laser diode 1.

Also, in FIG. 13, 42 indicates an automatic power control (APC) circuit for controlling the laser diode 1 to output the forward laser beam at a constant intensity. The automatic power control for the laser diode 1 is performed according to the intensity of the backward laser beam monitored in the first photo diode 13. For example, in cases where the intensity of the backward laser beam monitored in the first photo diode 13 is higher than a reference value, a driving current supplied to the laser diode 1 is decreased. In contrast, in cases where the intensity of the backward laser beam monitored in the first photo diode 13 is lower than the reference value, a driving current supplied to the laser diode 1 is increased. Therefore, because the intensity of the backward laser beam is adjusted to the reference value, the intensity of the forward laser beam radiated from the laser diode 1 is adjusted to a setting value.

The forward laser beam reflected on the package window 3 is transmitted through the first lens 2 and is converged at a narrow area placed above the laser diode 1. Thereafter, the reflected laser beam converged is diverged and is transmitted toward the upper right direction. Because the light shielding plate 41 is arranged in the rear of the laser diode 1 and because the through hole 41a is placed at a low position of the light shielding plate 41, the reflected laser beam transmitted toward the upper right direction does not reach the through hole 41a of the light shielding plate 41 but is absorbed in the light shielding plate 41. Therefore, the light shielding plate 41 prevents the reflected laser beam from being received in the first photo diode 13, and the intensity of the forward laser beam radiated from the laser diode 1 is adjusted according to the intensity of the backward laser beam monitored in the first photo diode 13.

As is described above, in the fourth embodiment, the light shielding plate 41 is arranged between the laser diode 1 and the first photo diode 13 on the base carrier 17, and the through hole 41a is formed at the low position of the light shielding plate 41 so as to transmit the backward laser beam through the through hole 41a. Accordingly, the light shielding plate 41 can reliably shield the first photo diode 13 from the reflected laser beam which is converged above the laser diode 1 and is diverged in the upper right direction, and the light shielding plate 41 can reliably prevent the reflected laser beam from being received in the first photo diode 13.

Also, in the fourth embodiment, even though a degree of inclination of the package window 3 changes with a temperature of the hermetically-sealed package 4, because the light shielding plate 41 is widely arranged between the laser diode 1 and the first photo diode 13 on the base carrier 17, the light shielding plate 41 can reliably shield the first photo diode 13 from the reflected laser beam. Accordingly, the intensity of the forward laser beam radiated from the laser diode 1 can be stably and accurately adjusted under the control of the APC circuit 42.

Also, in the fourth embodiment, the soldering of the light shielding plate 41 to the upper surface 1a of the laser diode 1 is not adopted. That is, the light shielding plate 41 is widely arranged between the laser diode 1 and the first photo diode 13 on the base carrier 17. Therefore, the bonding wire 23 can be reliably connected with the upper surface 1a of the laser diode 1. Accordingly, the light shielding plate 41 can reliably shield the first photo diode 13 from the reflected laser beam without giving an adverse influence of the light shielding plate 41 on a driving current supplied to the laser diode 1 through the bonding wire 23.

Also, in cases where a distance between the laser diode 1 and the light shielding plate 41 is increased due to an optical member (not shown) arranged between the laser diode 1 and the first photo diode 13, an area of the light shielding plate 41 in the plane orthogonal to the optical axis of the laser diode 1 is increased. Therefore, the light shielding plate 41 can reliably shield the first photo diode 13 from the reflected laser beam.

Here, the APC circuit 4 is also used in the first to third embodiments and a following embodiment.

Embodiment 5

Figure 14:
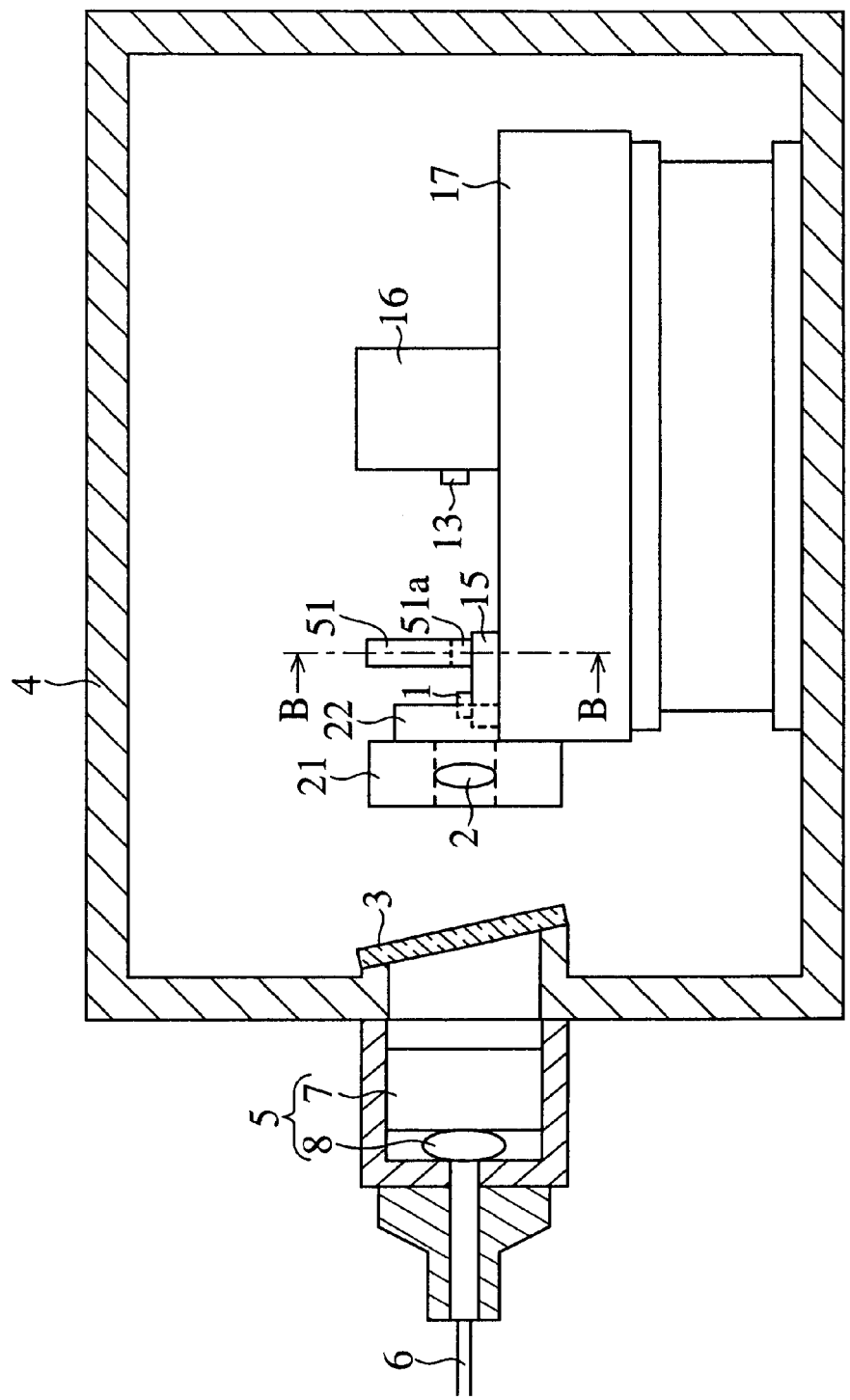
FIG. 14 is a vertical sectional view showing an internal configuration of a semiconductor laser device according to a fifth embodiment of the present invention.
Figure 15:
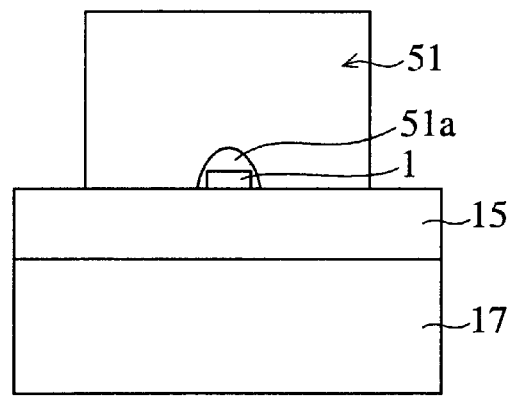
FIG. 15 is a sectional view taken substantially along line B—B of FIG. 14.
Figure 16:
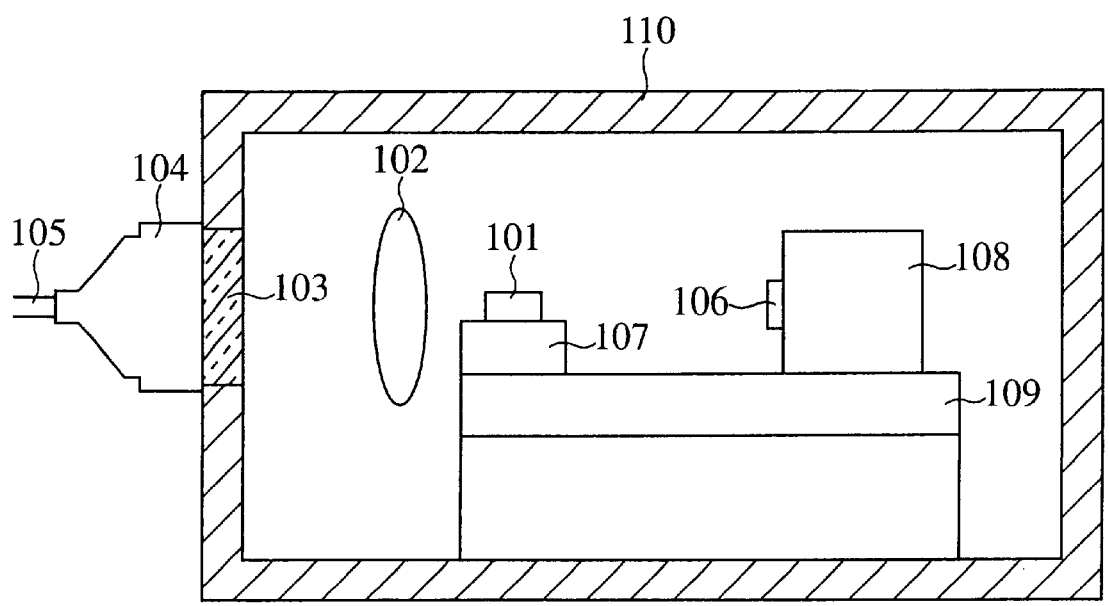
FIG. 16 is a view showing the configuration of a conventional semiconductor laser device.

FIG. 14 is a vertical sectional view showing an internal configuration of a semiconductor laser device according to a fifth embodiment of the present invention. FIG. 15 is a sectional view taken substantially along line B—B of FIG. 14. The constituent elements, which are the same as those shown in FIG. 1 or FIG. 2, are indicated by the same reference numerals as those of the constituent elements shown in FIG. 1 or FIG. 2, and additional description of those constituent elements is omitted.

In FIG. 14 and FIG. 15, 51 indicates a light shielding plate (or a light shielding member) arranged between the laser diode 1 and the first photo diode 13 on the LD carrier 15. The light shielding plate 51 widely extends in a plane orthogonal to the optical axis of the laser diode 1. That is, a width of the light shielding plate 51 in a direction perpendicular to the optical axis of the laser diode 1 in a horizontal plane is set to be sufficiently longer than a width of the laser diode 1 in the direction, and a height of the light shielding plate 51 is sufficiently higher than that of the laser diode 1. The light shielding plate 51 is made of kovar, and all surfaces of the light shielding plate 51 are coated to show a black color. Therefore, the laser beam is not transmitted through or reflected on the light shielding plate 51 but is absorbed in the light shielding plate 51. The light shielding plate 51 is soldered to the LD carrier 15. Also, a through hole 51a is formed in the bottom of the light shielding plate 51, and the optical axis of the laser diode 1 crosses the light shielding plate 51 at the through hole 51a. Therefore, the backward laser beam radiated from the laser diode 1 is transmitted through the through hole 51a of the light shielding plate 51 and is received in the first photo diode 13, and the intensity of the backward laser beam is monitored in the first photo diode 13. Also, the bonding wire 23 (not shown) is connected with the upper surface 1a of the laser diode 1.

The forward laser beam reflected on the package window 3 is transmitted through the first lens 2 and is converged at a narrow area placed above the laser diode 1. Thereafter, the reflected laser beam converged is diverged and is transmitted toward the upper right direction. Because the light shielding plate 51 is arranged in the rear of the laser diode 1 and because the through hole 51a is placed in the bottom of the light shielding plate 51, the reflected laser beam transmitted toward the upper right direction does not reach the through hole 51a of the light shielding plate 51 but is absorbed in the light shielding plate 51. Therefore, the light shielding plate 51 prevents the reflected laser beam from being received in the first photo diode 13.

As is described above, in the fifth embodiment, the light shielding plate 51 is arranged between the laser diode 1 and the first photo diode 13 on the LD carrier 15, and the through hole 51a is formed in the bottom of the light shielding plate 51 so as to transmit the backward laser beam through the through hole 51a. Accordingly, the light shielding plate 51 can reliably shield the first photo diode 13 from the reflected laser beam which is converged above the laser diode 1 and is diverged in the upper right direction, and the light shielding plate 51 can reliably prevent the reflected laser beam from being received in the first photo diode 13.

Also, in the fifth embodiment, even though a degree of inclination of the package window 3 changes with a temperature of the hermetically-sealed package 4, because the light shielding plate 51 is widely arranged between the laser diode 1 and the first photo diode 13 on the LD carrier 15, the light shielding plate 51 can reliably shield the first photo diode 13 from the reflected laser beam. Accordingly, the intensity of the forward laser beam radiated from the laser diode 1 can be stably and accurately adjusted under the control of the APC circuit 42.

Also, in the fifth embodiment, the soldering of the light shielding plate 51 to the upper surface 1a of the laser diode 1 is not adopted. That is, the light shielding plate 51 is widely arranged between the laser diode 1 and the first photo diode 13 on the LD carrier 15. Therefore, the bonding wire 23 can be reliably connected with the upper surface 1a of the laser diode 1. Accordingly, the light shielding plate 51 can reliably shield the first photo diode 13 from the reflected laser beam without giving an adverse influence of the light shielding plate 51 on a driving current supplied to the laser diode 1 through the bonding wire 23.

Also, in cases where a distance between the laser diode 1 and the light shielding plate 51 is increased due to an optical member (not shown) arranged between the laser diode 1 and the first photo diode 13, an area of the light shielding plate 51 in the plane orthogonal to the optical axis of the laser diode 1 is increased. Therefore, the light shielding plate 51 can reliably shield the first photo diode 13 from the reflected laser beam.

What is claimed is:

1. A wavelength monitoring device comprising:
    a semiconductor laser configured to radiate a forward laser beam and a backward laser beam;
    a photo detector configured to receive the backward laser beam radiated from the semiconductor laser;
    a lens configured to converge the forward laser beam radiated from the semiconductor laser;
    a window which transmits a most portion of the forward laser beam converged by the lens and on which the remaining portion of the forward laser beam is reflected as a reflected laser beam;
    a lens fixing member to which the lens is fixed; and
    a light shielding member, supported by the lens fixing member and configured to shield the photo detector from the reflected laser beam.

2. A wavelength monitoring device according to claim 1, wherein the semiconductor laser is partially covered with the light shielding member, the wavelength monitoring device further comprising:
    a bonding wire which is connected with an upper surface of the semiconductor laser not covered with the light shielding member and through which an electric power is supplied to the semiconductor laser.

3. A wavelength monitoring device according to claim 2, wherein a backward end portion of the semiconductor laser is backwardly protruded from a backward surface of the light shielding member, and the bonding wire is connected with an upper surface of the backward end portion of the semiconductor laser.

4. A wavelength monitoring device according to claim 1, wherein a width of the light shielding member in a direction perpendicular to an optical axis of the semiconductor laser in a plane parallel to an upper surface of the semiconductor laser is longer than a width of the semiconductor laser in the direction.

5. A wavelength monitoring device according to claim 1, wherein the window is inclined with respect to an optical axis of the semiconductor laser so as to return the reflected laser beam to a specific position placed at a peripheral area of the semiconductor laser, and the light shielding member is arranged at the specific position of the peripheral area of the semiconductor laser.

6. A wavelength monitoring device according to claim 1, wherein the window is inclined with respect to an optical axis of the semiconductor laser by placing a lower portion of the window near to the lens as compared with a position of an upper portion of the lens, and the light shielding member prevents the reflected laser beam from transmitting through an upper peripheral area of the semiconductor laser.

7. A wavelength monitoring device according to claim 1, wherein the light shielding member is formed in a U shape and covers an upper peripheral area and side peripheral areas of the semiconductor laser.

8. A wavelength monitoring device according to claim 1, wherein the light shielding member partially surrounds peripheral areas of the semiconductor laser without making contact with the semiconductor laser.

9. A wavelength monitoring device according to claim 1, further comprising an optical element arranged between the semiconductor laser and the photo detector.

10. A wavelength monitoring device according to claim 1, further comprising a control circuit configured to adjust an intensity of the forward laser beam radiated from the semiconductor laser according to an intensity of the backward laser beam detected in the photo diode.

11. A wavelength monitoring device according to claim 1, wherein the light shielding member is a flat plate extending in a plane perpendicular to an optical axis of the semiconductor laser.

12. A wavelength monitoring device according to claim 1, wherein the light shielding member is not soldered to the semiconductor laser.

13. A wavelength monitoring device comprising:
    a semiconductor laser configured to radiate a forward laser beam and a backward laser beam;
    a photo detector configured to receive the backward laser beam radiated from the semiconductor laser;
    a window which transmits a most portion of the forward laser beam radiated from the semiconductor laser and on which the remaining portion of the forward laser beam is reflected as a reflected laser beam;
    a carrier on which the semiconductor laser is mounted; and a light shielding member which is fixed to the carrier and is configured to shield the photo detector from the reflected laser beam.

14. A wavelength monitoring device according to claim 13, wherein the semiconductor laser is partially covered with the light shielding member, the wavelength monitoring device further comprising:
a bonding wire which is connected with an upper surface of the semiconductor laser not covered with the light shielding member and through which an electric power is supplied to the semiconductor laser.

15. A wavelength monitoring device according to claim 14, wherein a backward end portion of the semiconductor laser is backwardly protruded from a backward surface of the light shielding member, and the bonding wire is connected with an upper surface of the backward end portion of the semiconductor laser.

16. A wavelength monitoring device according to claim 13, wherein a width of the light shielding member in a direction perpendicular to an optical axis of the semiconductor laser in a plane parallel to an upper surface of the semiconductor laser is longer than a width of the semiconductor laser in the direction.

17. A wavelength monitoring device according to claim 13, wherein the window is inclined with respect to an optical axis of the semiconductor laser so as to return the reflected laser beam to a specific position placed at a peripheral area of the semiconductor laser, and the light shielding member is arranged at the specific position of the peripheral area of the semiconductor laser.

18. A wavelength monitoring device according to claim 13, wherein the window is inclined with respect to an optical axis of the semiconductor laser by placing a lower portion of the window near to the lens as compared with a position of an upper portion of the lens, and the light shielding member prevents the reflected laser beam from transmitting through an upper peripheral area of the semiconductor laser.

19. A wavelength monitoring device according to claim 13, wherein the light shielding member is formed in a U shape and covers an upper peripheral area and side peripheral areas of the semiconductor laser.

20. A wavelength monitoring device according to claim 13, wherein the light shielding member is formed in an L shape so as to have both a horizontally-extending portion covering an upper peripheral area of the semiconductor laser and a foot portion fixed to the carrier.

21. A wavelength monitoring device according to claim 20, wherein one of a circuit substrate for high frequency, an electric current feeding and modulating circuit, a thermister and a micro-strip line is placed on an upper surface of the carrier which is placed on an opposite side to the foot portion of the light shielding member through the semiconductor laser.

22. A wavelength monitoring device according to claim 13, wherein the light shielding member is arranged between the semiconductor laser and the photo detector, and the light shielding member has a through-hole through which the backward laser beam radiated from the semiconductor laser is transmitted to the photo detector.

23. A wavelength monitoring device according to claim 13, wherein the light shielding member partially surrounds peripheral areas of the semiconductor laser without making contact with the semiconductor laser.

24. A wavelength monitoring device according to claim 13, further comprising an optical element arranged between the semiconductor laser and the photo detector.

25. A wavelength monitoring device according to claim 13, further comprising a control circuit configured to adjust an intensity of the forward laser beam radiated from the semiconductor laser according to an intensity of the backward laser beam detected in the photo diode.

26. A wavelength monitoring device according to claim 13, wherein the light shielding member is a flat plate extending in a plane perpendicular to an optical axis of the semiconductor laser.

27. A wavelength monitoring device according to claim 13, wherein the light shielding member is not soldered to the semiconductor laser.

28. A wavelength monitoring device comprising:
a semiconductor laser configured to radiate a forward laser beam and a backward laser beam;
a carrier having a slot which is formed on a top surface, the semiconductor laser being arranged in the slot;
a photo detector configured to receive the backward laser beam which is radiated from the semiconductor laser;
a window which transmits a most portion of the forward laser beam radiated from the semiconductor laser and on which the remaining portion of the forward laser beam is reflected as a reflected laser beam; and
a light shielding member, which is placed on the upper surface of the carrier so as to straddle the slot of the carrier and is configured to shield the photo detector from the reflected laser beam.

29. A wavelength monitoring device according to claim 28, wherein the semiconductor laser is partially covered with the light shielding member, the wavelength monitoring device further comprising:
a bonding wire which is connected with an upper surface of the semiconductor laser not covered with the light shielding member and through which an electric power is supplied to the semiconductor laser.

30. A wavelength monitoring device according to claim 29, wherein a backward end portion of the semiconductor laser is backwardly protruded from a backward surface of the light shielding member, and the bonding wire is connected with an upper surface of the backward end portion of the semiconductor laser.

31. A wavelength monitoring device according to claim 28, wherein a width of the light shielding member in a direction perpendicular to an optical axis of the semiconductor laser in a plane parallel to an upper surface of the semiconductor laser is longer than a width of the semiconductor laser in the direction.

32. A wavelength monitoring device according to claim 28, wherein the window is inclined with respect to an optical axis of the semiconductor laser so as to return the reflected laser beam to a specific position placed at a peripheral area of the semiconductor laser, and the light shielding member is arranged at the specific position of the peripheral area of the semiconductor laser.

33. A wavelength monitoring device according to claim 28, wherein the window is inclined with respect to an optical axis of the semiconductor laser by placing a lower portion of the window near to the lens as compared with a position of an upper portion of the lens, and the light shielding member prevents the reflected laser beam from transmitting through an upper peripheral area of the semiconductor laser.

34. A wavelength monitoring device according to claim 28, wherein the light shielding member partially surrounds peripheral areas of the semiconductor laser without making contact with the semiconductor laser.

35. A wavelength monitoring device according to claim 28, further comprising an optical element arranged between the semiconductor laser and the photo detector.

36. A wavelength monitoring device according to claim 28, further comprising a control circuit configured to adjust an intensity of the forward laser beam radiated from the semiconductor laser according to an intensity of the backward laser beam detected in the photo diode.

37. A wavelength monitoring device according to claim 28, wherein the light shielding member is not soldered to the semiconductor laser.

38. A wavelength monitoring device comprising:
- a semiconductor laser configured to radiate a forward laser beam and a backward laser beam;
- a photo detector configured to receive the backward laser beam radiated from the semiconductor laser;
- a lens configured to converge the forward laser beam radiated from the semiconductor laser;
- a window which transmits a most portion of the forward laser beam converged by the lens and on which the remaining portion of the forward laser beam is reflected as a reflected laser beam;
- a lens fixing member to which the lens is fixed; and
- a light shielding member which is supported by the lens fixing member and is formed in a U shape so as to cover an upper peripheral area of the semiconductor device.

39. A wavelength monitoring device according to claim 38, wherein the semiconductor laser is partially covered with the light shielding member, the wavelength monitoring device further comprising:
- a bonding wire which is connected with an upper surface of the semiconductor laser not covered with the light shielding member and through which an electric power is supplied to the semiconductor laser.

40. A wavelength monitoring device according to claim 39, wherein a backward end portion of the semiconductor laser is backwardly protruded from a backward surface of the light shielding member, and the bonding wire is connected with an upper surface of the backward end portion of the semiconductor laser.

41. A wavelength monitoring device according to claim 38, wherein a width of the light shielding member in a direction perpendicular to an optical axis of the semiconductor laser in a plane parallel to an upper surface of the semiconductor laser is longer than a width of the semiconductor laser in the direction.

42. A wavelength monitoring device according to claim 38, wherein the window is inclined with respect to an optical axis of the semiconductor laser so as to return the reflected laser beam to a specific position placed at a peripheral area of the semiconductor laser, and the light shielding member is arranged at the specific position of the peripheral area of the semiconductor laser.

43. A wavelength monitoring device according to claim 38, wherein the window is inclined with respect to an optical axis of the semiconductor laser by placing a lower portion of the window near to the lens as compared with a position of an upper portion of the lens, and the light shielding member prevents the reflected laser beam from transmitting through an upper peripheral area of the semiconductor laser.

44. A wavelength monitoring device according to claim 38, wherein the light shielding member partially surrounds peripheral areas of the semiconductor laser without making contact with the semiconductor laser.

45. A wavelength monitoring device according to claim 38, further comprising an optical element arranged between the semiconductor laser and the photo detector.

46. A wavelength monitoring device according to claim 38, further comprising a control circuit configured to adjust an intensity of the forward laser beam radiated from the semiconductor laser according to an intensity of the backward laser beam detected in the photo diode.

47. A wavelength monitoring device according to claim 38, wherein the light shielding member is a flat plate extending in a plane perpendicular to an optical axis of the semiconductor laser.

48. A wavelength monitoring device according to claim 38, wherein the light shielding member is not soldered to the semiconductor laser.

49. A wavelength monitoring device comprising:
- a semiconductor laser configured to radiate a forward laser beam and a backward laser beam;
- a photo detector configured to receive the backward laser beam radiated from the semiconductor laser;
- a window which transmits a most portion of the forward laser beam radiated from the semiconductor laser and on which the remaining portion of the forward laser beam is reflected as a reflected laser beam;
- a carrier on which the semiconductor laser is mounted; and
- a light shielding member which is fixed to the carrier and is formed in a U shape so as to cover an upper peripheral area of the semiconductor device.

50. A wavelength monitoring device according to claim 49, wherein the semiconductor laser is partially covered with the light shielding member, the wavelength monitoring device further comprising:
- a bonding wire which is connected with an upper surface of the semiconductor laser not covered with the light shielding member and through which an electric power is supplied to the semiconductor laser.

51. A wavelength monitoring device according to claim 50, wherein a backward end portion of the semiconductor laser is backwardly protruded from a backward surface of the light shielding member, and the bonding wire is connected with an upper surface of the backward end portion of the semiconductor laser.

52. A wavelength monitoring device according to claim 49, wherein a width of the light shielding member in a direction perpendicular to an optical axis of the semiconductor laser in a plane parallel to an upper surface of the semiconductor laser is longer than a width of the semiconductor laser in the direction.

53. A wavelength monitoring device according to claim 49, wherein the window is inclined with respect to an optical axis of the semiconductor laser so as to return the reflected laser beam to a specific position placed at a peripheral area of the semiconductor laser, and the light shielding member is arranged at the specific position of the peripheral area of the semiconductor laser.

54. A wavelength monitoring device according to claim 49, wherein the window is inclined with respect to an optical axis of the semiconductor laser by placing a lower portion of the window near to the lens as compared with a position of an upper portion of the lens, and the light shielding member prevents the reflected laser beam from transmitting through an upper peripheral area of the semiconductor laser.

55. A wavelength monitoring device according to claim 49, wherein the light shielding member partially surrounds peripheral areas of the semiconductor laser without making contact with the semiconductor laser.

56. A wavelength monitoring device according to claim 49, further comprising an optical element arranged between the semiconductor laser and the photo detector.

57. A wavelength monitoring device according to claim 49, further comprising a control circuit configured to adjust an intensity of the forward laser beam radiated from the semiconductor laser according to an intensity of the backward laser beam detected in the photo diode.

58. A wavelength monitoring device according to claim 49, wherein the light shielding member is a flat plate extending in a plane perpendicular to an optical axis of the semiconductor laser.

59. A wavelength monitoring device according to claim 49, wherein the light shielding member is not soldered to the semiconductor laser.

60. A wavelength monitoring device comprising:
a semiconductor laser configured to radiate a forward laser beam and a backward laser beam;
a photo detector configured to receive the backward laser beam radiated from the semiconductor laser;
a window which transmits a most portion of the forward laser beam radiated from the semiconductor laser and on which the remaining portion of the forward laser beam is reflected as a reflected laser beam;
a carrier on which the semiconductor laser is mounted; and
a light shielding member which is fixed to the carrier and is formed in an L shape so as to cover an upper peripheral area of the semiconductor device.

61. A wavelength monitoring device according to claim 60, wherein the semiconductor laser is partially covered with the light shielding member, the wavelength monitoring device further comprising:
a bonding wire which is connected with an upper surface of the semiconductor laser not covered with the light shielding member and through which an electric power is supplied to the semiconductor laser.

62. A wavelength monitoring device according to claim 61, wherein a backward end portion of the semiconductor laser is backwardly protruded from a backward surface of the light shielding member, and the bonding wire is connected with an upper surface of the backward end portion of the semiconductor laser.

63. A wavelength monitoring device according to claim 60, wherein a width of the light shielding member in a direction perpendicular to an optical axis of the semiconductor laser in a plane parallel to an upper surface of the semiconductor laser is longer than a width of the semiconductor laser in the direction.

64. A wavelength monitoring device according to claim 60, wherein the window is inclined with respect to an optical axis of the semiconductor laser so as to return the reflected laser beam to a specific position placed at a peripheral area of the semiconductor laser, and the light shielding member is arranged at the specific position of the peripheral area of the semiconductor laser.

65. A wavelength monitoring device according to claim 60, wherein the window is inclined with respect to an optical axis of the semiconductor laser by placing a lower portion of the window near to the lens as compared with a position of an upper portion of the lens, and the light shielding member prevents the reflected laser beam from transmitting through an upper peripheral area of the semiconductor laser.

66. A wavelength monitoring device according to claim 60, wherein the light shielding member partially surrounds peripheral areas of the semiconductor laser without making contact with the semiconductor laser.

67. A wavelength monitoring device according to claim 60, further comprising an optical element arranged between the semiconductor laser and the photo detector.

68. A wavelength monitoring device according to claim 60, further comprising a control circuit configured to adjust an intensity of the forward laser beam radiated from the semiconductor laser according to an intensity of the backward laser beam detected in the photo diode.

69. A wavelength monitoring device according to claim 60, wherein the light shielding member is a flat plate extending in a plane perpendicular to an optical axis of the semiconductor laser.

70. A wavelength monitoring device according to claim 60, wherein the light shielding member is not soldered to the semiconductor laser.

71. A wavelength monitoring device comprising:
a semiconductor laser configured to radiate a forward laser beam and a backward laser beam;
a carrier having a slot which is formed on a top surface, the semiconductor laser being arranged in the slot;
a photo detector configured to receive the backward laser beam which is radiated from the semiconductor laser;
a window which transmits a most portion of the forward laser beam radiated from the semiconductor laser and on which the remaining portion of the forward laser beam is reflected as a reflected laser beam; and
a light shielding member which is placed on the upper surface of the carrier so as to straddle the slot of the carrier and so as to cover an upper peripheral area of the semiconductor device.

72. A wavelength monitoring device according to claim 71, wherein the semiconductor laser is partially covered with the light shielding member, the wavelength monitoring device further comprising:
a bonding wire which is connected with an upper surface of the semiconductor laser not covered with the light shielding member and through which an electric power is supplied to the semiconductor laser.

73. A wavelength monitoring device according to claim 72, wherein a backward end portion of the semiconductor laser is backwardly protruded from a backward surface of the light shielding member, and the bonding wire is connected with an upper surface of the backward end portion of the semiconductor laser.

74. A wavelength monitoring device according to claim 71, wherein a width of the light shielding member in a direction perpendicular to an optical axis of the semiconductor laser in a plane parallel to an upper surface of the semiconductor laser is longer than a width of the semiconductor laser in the direction.

75. A wavelength monitoring device according to claim 71, wherein the window is inclined with respect to an optical axis of the semiconductor laser so as to return the reflected laser beam to a specific position placed at a peripheral area of the semiconductor laser, and the light shielding member is arranged at the specific position of the peripheral area of the semiconductor laser.

76. A wavelength monitoring device according to claim 71, wherein the window is inclined with respect to an optical axis of the semiconductor laser by placing a lower portion of the window near to the lens as compared with a position of an upper portion of the lens, and the light shielding member prevents the reflected laser beam from transmitting through an upper peripheral area of the semiconductor laser.

77. A wavelength monitoring device according to claim 71, wherein the light shielding member partially surrounds peripheral areas of the semiconductor laser without making contact with the semiconductor laser.

78. A wavelength monitoring device according to claim 71, further comprising an optical element arranged between the semiconductor laser and the photo detector.

79. A wavelength monitoring device according to claim 71, further comprising a control circuit configured to adjust an intensity of the forward laser beam radiated from the semiconductor laser according to an intensity of the backward laser beam detected in the photo diode.

80. A wavelength monitoring device according to claim 71, wherein the light shielding member is not soldered to the semiconductor laser.

* * * * *